(12) United States Patent
Ahn et al.

(10) Patent No.: US 12,094,846 B2
(45) Date of Patent: Sep. 17, 2024

(54) NONVOLATILE MEMORY DEVICE, SYSTEM INCLUDING THE SAME AND METHOD OF FABRICATING THE SAME

(71) Applicant: SAMSUNG ELECTRONICS CO., LTD., Suwon-si (KR)

(72) Inventors: Jae Ho Ahn, Seoul (KR); Ji Won Kim, Seoul (KR); Sung-Min Hwang, Hwaseong-si (KR); Joon-Sung Lim, Seongnam-si (KR); Suk Kang Sung, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/349,017

(22) Filed: Jul. 7, 2023

(65) Prior Publication Data
US 2024/0014157 A1     Jan. 11, 2024

Related U.S. Application Data

(63) Continuation of application No. 17/240,641, filed on Apr. 26, 2021, now Pat. No. 11,728,304.

(30) Foreign Application Priority Data

Sep. 28, 2020   (KR) .................. 10-2020-0125854

(51) Int. Cl.
*H01L 25/065*   (2023.01)
*H01L 21/768*   (2006.01)
*H01L 23/00*    (2006.01)
*H01L 23/535*   (2006.01)
(Continued)

(52) U.S. Cl.
CPC ........ *H01L 24/08* (2013.01); *H01L 21/76805* (2013.01); *H01L 21/76895* (2013.01);
(Continued)

(58) Field of Classification Search
CPC ... H01L 24/08; H01L 23/535; H01L 25/0657; H01L 25/18; H01L 27/11556;
(Continued)

(56) References Cited

U.S. PATENT DOCUMENTS 10,211,166 B2    2/2019  Matsuo
10,283,452 B2    5/2019  Zhu et al.
(Continued)

FOREIGN PATENT DOCUMENTS

KR    20200037895    4/2020
KR    20200039800    4/2020

*Primary Examiner* — Thanh Y. Tran
(74) *Attorney, Agent, or Firm* — Fish & Richardson P.C.

(57) ABSTRACT

A nonvolatile memory device including a substrate extending in a first direction, a ground selection line extending in the first direction on the substrate, a plurality of word lines stacked sequentially on the ground selection line and extending in the first direction, a landing pad spaced apart from the ground selection line and the plurality of word lines in the first direction, a rear contact plug connected to a lower face of the landing pad and extending in a second direction intersecting the first direction, a front contact plug connected to an upper face of the landing pad opposite the lower face and extending in the second direction, an input/output pad electrically connected to the rear contact plug, and an upper bonding pad electrically connected to the front contact plug and connected to at least a part of a plurality of circuit elements of the nonvolatile memory device.

20 Claims, 25 Drawing Sheets

(51) Int. Cl.
 *H01L 25/18* (2023.01)
 *H10B 41/27* (2023.01)
 *H10B 43/27* (2023.01)

(52) U.S. Cl.
 CPC ........ *H01L 23/535* (2013.01); *H01L 25/0657* (2013.01); *H01L 25/18* (2013.01); *H10B 41/27* (2023.02); *H10B 43/27* (2023.02); *H01L 2224/08145* (2013.01); *H01L 2924/1431* (2013.01); *H01L 2924/14511* (2013.01)

(58) Field of Classification Search
 CPC ..... H01L 27/11582; H01L 2224/08145; H01L 2924/1431; H01L 2924/14511; H01L 2224/32145; H01L 24/05; H01L 2224/48145
 See application file for complete search history.

(56) References Cited

U.S. PATENT DOCUMENTS

| | | |
|---|---|---|
| 10,354,980 B1 | 7/2019 | Mushiga |
| 10,629,616 B1 | 4/2020 | Kai et al. |
| 2019/0296041 A1 | 9/2019 | Yamasaka et al. |
| 2020/0006371 A1 | 1/2020 | Huo et al. |
| 2020/0066703 A1 | 2/2020 | Kim et al. |
| 2020/0402579 A1* | 12/2020 | Park ............ G06N 3/04 |
| 2021/0202457 A1* | 7/2021 | Choi ............ G11C 16/08 |
| 2022/0035597 A1* | 2/2022 | Jung ............ H01L 22/32 |
| 2022/0122673 A1 | 4/2022 | Kim et al. |
| 2022/0399367 A1 | 12/2022 | Kim et al. |
| 2022/0399401 A1 | 12/2022 | Kwon et al. |

\* cited by examiner

NONVOLATILE MEMORY DEVICE, SYSTEM INCLUDING THE SAME AND METHOD OF FABRICATING THE SAME

CROSS-REFERENCE TO RELATED APPLICATION

This application is a continuation of U.S. application Ser. No. 17/240,641, filed on Apr. 26, 2021, which claims priority under 35 U.S.C. § 119 to Korean Patent Application No. 10-2020-0125854 filed on Sep. 28, 2020 in the Korean Intellectual Property Office, each of which is hereby incorporated by reference in its entirety.

BACKGROUND

The present disclosure relates to nonvolatile memory devices, systems including the same, and methods of fabricating the nonvolatile memory devices.

Semiconductor memory devices may be broadly classified as volatile memory devices and nonvolatile memory devices. The degree of integration of nonvolatile memory devices has increased to enable improved performance and to reduce cost, as required by consumers. Incidentally, in the case of a two-dimensional or planar memory device, the degree of integration is determined by an area occupied by unit memory cells. Therefore, recently, three-dimensional memory devices in which unit memory cells are placed vertically have been developed.

SUMMARY

Embodiments of the inventive concepts provide a nonvolatile memory device having improved alignment margin between a contact plug connected to the outside and a contact plug for connecting circuit elements of a peripheral circuit region.

Embodiments of the inventive concepts also provide a nonvolatile memory system having improved alignment margin between a contact plug connected to the outside and a contact plug for connecting circuit elements of a peripheral circuit region.

Embodiments of the inventive concepts also provide a method of fabricating a nonvolatile memory device having improved alignment margin between a contact plug connected to the outside and a contact plug for connecting circuit elements of a peripheral circuit region.

Embodiments of the inventive concepts provide a nonvolatile memory device including a substrate extending in a first direction; a ground selection line extending in the first direction on the substrate; a plurality of word lines stacked sequentially on the ground selection line and extending in the first direction; a landing pad spaced apart from the ground selection line and the plurality of word lines in the first direction; a rear contact plug connected to a lower face of the landing pad and extending in a second direction intersecting the first direction and perpendicular to an upper surface of the substrate; a front contact plug connected to an upper face of the landing pad that is opposite the lower face, the front contact plug extending in the second direction; an input/output pad electrically connected to the rear contact plug; and an upper bonding pad electrically connected to the front contact plug and connected to at least a part of a plurality of circuit elements of the nonvolatile memory device.

Embodiments of the inventive concepts further provide a nonvolatile memory device including a peripheral region including a plurality of circuit elements; and a cell region electrically connected to the plurality of circuit elements and that stores data. The cell region includes a substrate extending in a first direction; a ground selection line extending in the first direction on the substrate; a plurality of word lines stacked sequentially on the ground selection line and extending in the first direction; a channel structure penetrating the ground selection line and the plurality of word lines and extending in a second direction intersecting the first direction and perpendicular to an upper surface of the nonvolatile memory device; a landing pad spaced apart from the ground selection line and the plurality of word lines in the first direction; a rear contact plug connected to a lower face of the landing pad and extending in the second direction; a front contact plug connected to an upper face of the landing pad that is opposite the lower face, the front contact plug extending in the second direction; an input/output pad electrically connected to the rear contact plug; and an upper bonding pad electrically connected to the front contact plug and connected to at least a part of a plurality of circuit elements of the nonvolatile memory device.

Embodiments of the inventive concepts still further provide a nonvolatile memory system including a main board; a nonvolatile memory device on the main board; and a controller electrically connected to the nonvolatile memory device on the main board. The nonvolatile memory device includes a substrate extending in a first direction; a ground selection line extending in the first direction on the substrate; a plurality of word lines stacked sequentially on the ground selection line and extending in the first direction; a channel structure penetrating the ground selection line and the plurality of word lines and extending in a second direction intersecting the first direction and perpendicular to an upper surface of the substrate, the channel structure storing data; a landing pad spaced apart from the ground selection line and the plurality of word lines in the first direction; a rear contact plug connected to a lower face of the landing pad and extending in the second direction intersecting the first direction; a front contact plug connected to an upper face of the landing pad that is opposite the lower face, the front contact plug extending in the second direction; an input/output pad electrically connected to the rear contact plug; and an upper bonding pad electrically connected to the front contact plug and connected to at least a part of a plurality of circuit elements of the nonvolatile memory device.

DETAILED DESCRIPTION

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
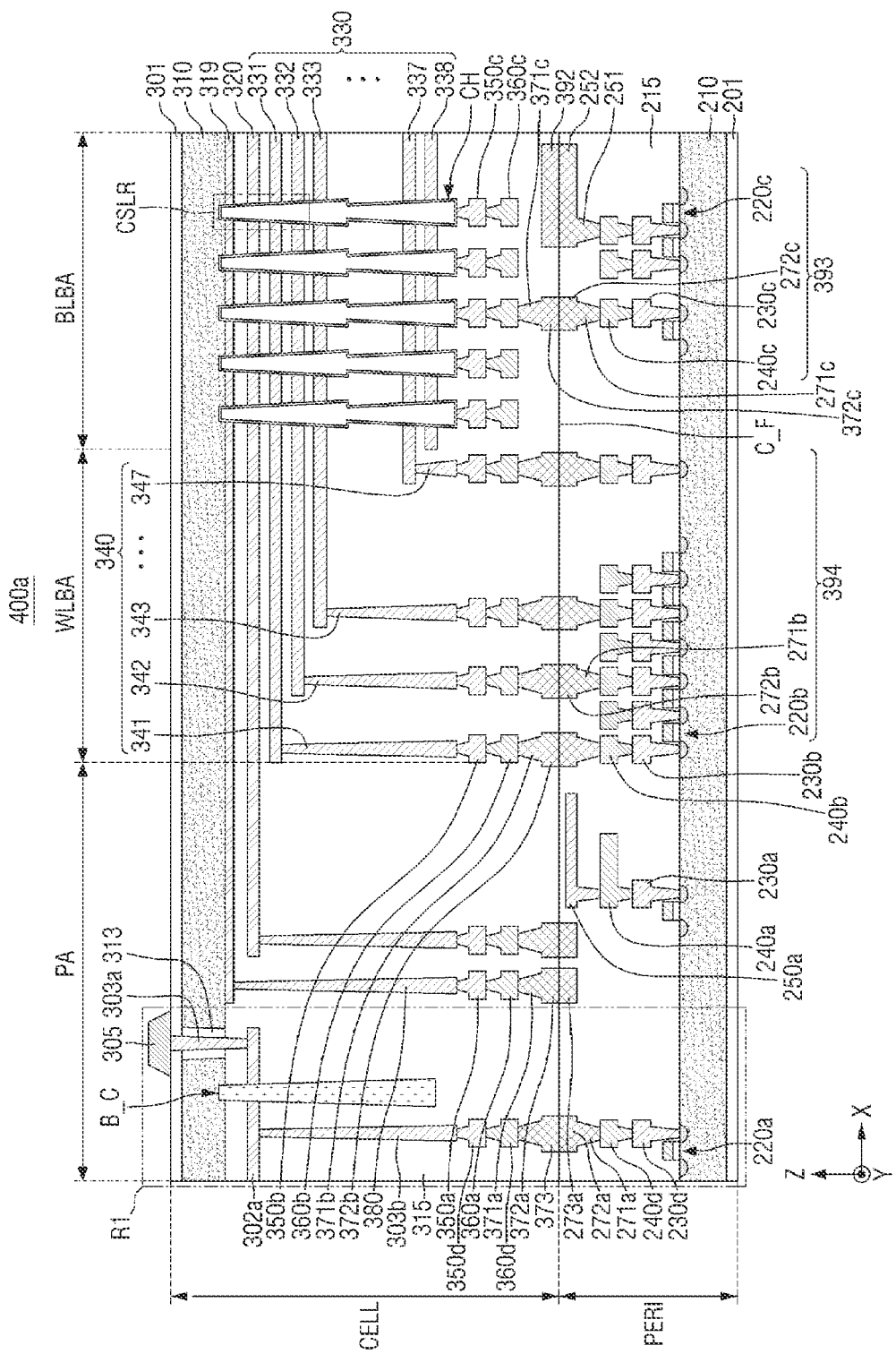
FIG. 1 illustrates an exemplary diagram of a nonvolatile memory device according to embodiments of the inventive concepts.
Figure 2:
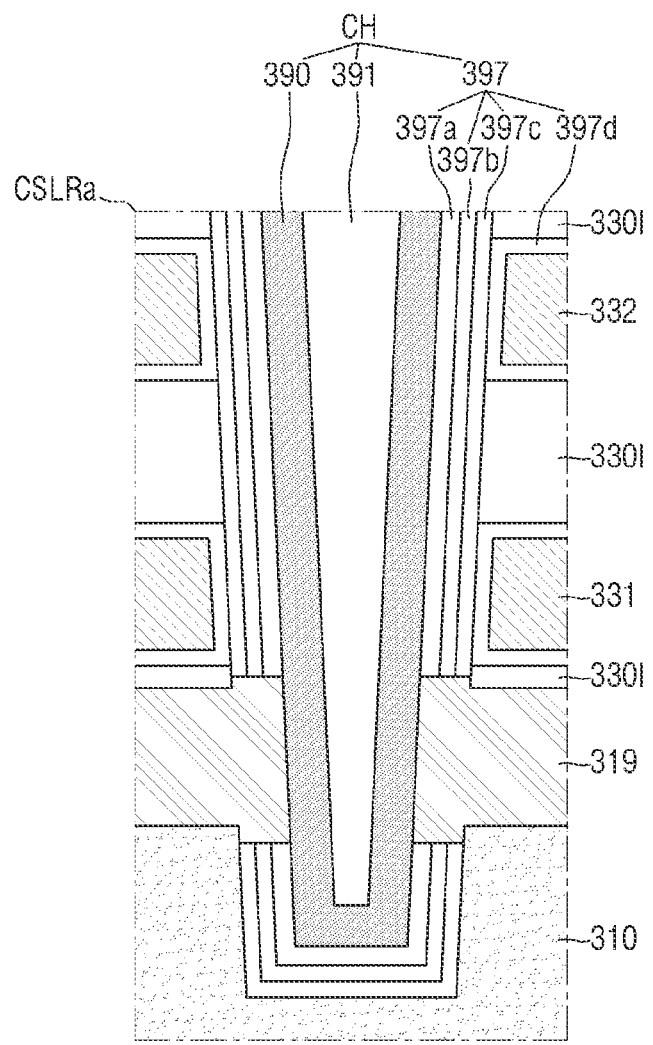
FIG. 2 illustrates an exemplary enlarged view of region CSLR of FIG. 1 according to embodiments of the inventive concepts.
Figure 3:
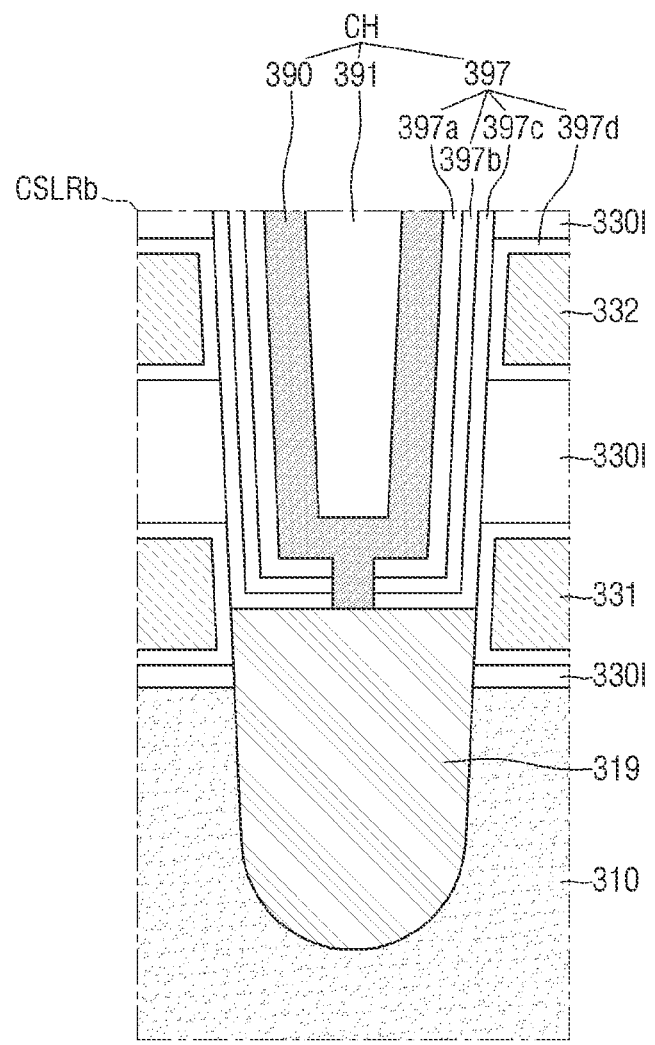
FIG. 3 illustrates an exemplary enlarged view of region CSLR of FIG. 1 according to other embodiments of the inventive concepts.

FIG. 1 illustrates an exemplary diagram of a nonvolatile memory device according to embodiments of the inventive concepts. FIGS. 2 and 3 illustrate exemplary enlarged views of a region CSLR of FIG. 1.

Referring to FIG. 1, a nonvolatile memory device 400a according to some embodiments may have a C2C (chip to chip) structure. The C2C structure may mean a structure in which an upper chip including a cell region CELL is manufactured on a first wafer, a lower chip including a peripheral circuit region PERI is manufactured on a second wafer different from the first wafer, and after that, the upper chip and the lower chip are bonded to each other at contact face C_F in a bonding way or technique. As an example, the bonding way may mean a way of electrically connecting a bonding metal formed on an uppermost metal layer of the upper chip and a bonding metal formed on an uppermost metal layer of the lower chip. For example, when the upper bonding metal is formed of copper (Cu), the bonding way may be a Cu—Cu bonding way, and the bonding metal may be formed of aluminum or tungsten.

Each of the peripheral circuit region PERI and the cell region CELL of the memory device 400a according to some embodiments may include an external pad bonding region PA, a word line bonding region WLBA, and a bit line bonding region BLBA.

The peripheral circuit region PERI may include a first substrate 210, an interlayer insulation layer 215, a plurality of circuit elements 220a, 220b and 220c formed on the first substrate 210, first metal layers 230a, 230b, 230c and 230d connected to each of the plurality of circuit elements 220a, 220b and 220c, and second metal layers 240a, 240b, 240c and 240d formed on the first metal layers 230a, 230b, 230c and 230d. In an embodiment, for example the first metal layers 230a, 230b, 230c and 230d may be formed of tungsten which has a relatively high resistance, and the second metal layers 240a, 240b, 240c and 240d may be formed of copper which has a relatively low resistance.

Although only the first metal layers 230a, 230b, 230c and 230d and the second metal layers 240a, 240b, 240c and 240d are shown and explained, the embodiments are not limited thereto, and at least one or more metal layers may be further formed on the second metal layers 240a, 240b, 240c and 240d. At least a part of one or more metal layers formed above the second metal layers 240a, 240b, 240c and 240d may be formed of aluminum or the like, which has a lower resistance than copper which forms the second metal layers 240a, 240b, 240c and 240d. The third metal layer 250a may be connected to the second metal layer 240a.

An interlayer insulation layer 215 is disposed on the first substrate 210 to cover a plurality of circuit elements 220a, 220b and 220c, the first metal layers 230a, 230b, 230c and 230d, and the second metal layers 240a, 240b, 240c and 240d, and may include insulating materials such as for example silicon oxides and silicon nitrides. The lower insulating film 201 covers the lower face of the first substrate 210.

Lower bonding metals 271b and 272b may be formed on the second metal layer 240b of the word line bonding region WLBA. In the word line bonding region WLBA, the lower bonding metals 271b and 272b of the peripheral circuit region PERI may be electrically connected to the upper bonding metals 371b and 372b of the cell region CELL in the bonding way. The lower bonding metals 271b and 272b and the upper bonding metals 371b and 372b may be formed of aluminum, copper, tungsten, or the like.

The cell region CELL may provide at least one memory block. The cell region CELL may include a second substrate 310 and a common source line 319. A plurality of word lines (331 to 338; 330) may be stacked on the second substrate 310 along a direction (a Z-axis direction) perpendicular to the upper face of the second substrate 310. String selection lines and a ground selection line may be placed above and below the word lines 330, and a plurality of word lines 330 may be placed between the string selection lines and the ground selection line.

In the bit line bonding region BLBA, the channel structure CH extends in a direction perpendicular to the upper face of the second substrate 310, and may penetrate the word lines 330, the string selection lines, and the ground selection line.

The channel structure CH extends in the vertical direction Z, as shown in FIGS. 2 and 3, and may include a data storage layer 397, a channel layer 390, a buried insulation layer 391 and the like. The channel layer 390 may be electrically connected to the first metal layer 350c and the second metal layer 360c. For example, the first metal layer 350c may be a bit line contact, and the second metal layer 360c may be a bit line. In an embodiment, the bit line 360c may extend along a second direction (Y-axis direction) parallel to the upper face of the second substrate 310.

The second substrate 310, the ground selection line 320 and the channel structures CH of the nonvolatile memory device 400a according to some embodiments may be configured in various forms. Through FIGS. 2 and 3 below, various structures of the second substrate 310, the ground selection line 320, and the channel structures CH of the nonvolatile memory device 300a according to some embodiments will be explained by expanding the region CSLR.

FIGS. 2 and 3 illustrate various exemplary enlarged views explanatory of the region CSLR of FIG. 1.

Referring to FIGS. 1 to 3, the channel layer 390 may extend in the third direction Z. Although the channel layer 390 is shown as having the shape of a stacked cup, this is only an example, and the channel layer 390 may also have various shapes such as for example a cylindrical shape, a square tubular shape, a solid filler shape and a single cup shape. The channel layer 390 may include, but is not limited to, semiconductor materials such as, for example, single crystal silicon, polycrystalline silicon, organic semiconductor matter and carbon nanostructures.

An interlayer insulation layer 3301 may correspond to the interlayer insulation layer 315 of FIG. 1. A data storage layer 397 may be interposed between the channel layer 390 and the word lines 330 including the ground selection line 320 (not shown in FIGS. 2 and 3). For example, the data storage layer 397 may extend along the side faces of the channel layer 390.

In some embodiments, the data storage layer 397 may be formed of multiple films. For example, the data storage layer 397 may include a tunnel insulation film 397a, a charge storage film 397b and a blocking insulation film 397c which are sequentially stacked on the channel layer 390. The tunnel insulation film 397a may include, for example, a silicon oxide or a high dielectric constant material having a higher dielectric constant than the silicon oxide (for example, aluminum oxide ($Al_2O_3$) and hafnium oxide ($HfO_2$)). The charge storage film 397b may include, for example, silicon nitride. The blocking insulation film 397c may include, for example, silicon oxide or a high dielectric constant material having a higher dielectric constant than silicon oxide. In some embodiments, the data storage layer 397 may further include a gate insulation film 397d that extends along the surface of each word line 330.

In some embodiments, the channel structure CH may further include a buried insulation layer 391. The buried insulation layer 391 may be formed to fill the inside of the semiconductor pattern 390 having a cup shape. The buried insulation layer 391 may include, but is not limited to, insulating materials such as for example silicon oxide.

The common source line 319 may be formed to be connected to the channel layer 390 of the channel structure CH.

As shown in FIG. 2, in some embodiments, the channel structure CH may penetrate the common source line 319 and be buried in the second substrate 310. The common source line 319 may penetrate a part of the data storage layer 397 and be connected to the side faces of the channel layer 390.

As shown in FIG. 3, in some embodiments, at least a part of the common source line 319 may be buried inside the second substrate 310. The common source line 319 may be formed, for example, from the second substrate 310 by a selective epitaxial growth (SEG) process. The channel structure CH may penetrate a part of the data storage layer 397 and be connected to the upper face of the common source line 319.

Referring to FIG. 1 again, a region in which the channel structure CH and the bit line 360c are placed may be defined as a bit line bonding region BLBA. The bit line 360c may be electrically connected to the circuit elements 220c that provide a page buffer 393 in the peripheral circuit region PERI in the bit line bonding region BLBA. As an example, the bit line 360c is connected to the upper bonding metals 371c and 372c in the peripheral circuit region PERI, and the upper bonding metals 371c and 372c may be connected to the lower bonding metals 271c and 272c connected to the circuit elements 220c of the page buffer 393.

In the word line bonding region WLBA, the word lines 330 may extend along the first direction (X-axis direction) parallel to the upper face of the second substrate 310, and may be connected to the plurality of cell contact plugs (341 to 347; 340). The word lines 330 and the cell contact plugs 340 may be connected at a pad provided by extending at least a part of the word lines 330 along the first direction at different lengths. The first metal layer 350b and the second metal layer 360b may be connected sequentially to the upper part of the cell contact plugs 340 connected to the word lines 330. The cell contact plugs 340 may be connected to the peripheral circuit region PERI through the upper bonding metals 371b and 372b of the cell region CELL and the lower bonding metals 271b and 272b of the peripheral circuit region PERI in the word line bonding region WLBA.

The cell contact plugs 340 may be electrically connected to the circuit elements 220b that provide a row decoder 394 in the peripheral circuit region PERI. In an embodiment, the operating voltage of the circuit elements 220b that provide the row decoder 394 may differ from the operating voltage of the circuit elements 220c that provide the page buffer 393. As an example, the operating voltage of the circuit elements 220c that provide the page buffer 393 may be higher than the operating voltage of the circuit elements 220b that provide the row decoder 394.

A common source line contact plug 380 may be placed in the external pad bonding region PA. The common source line contact plug 380 is formed of a conductive material such as metal, metal compound or polysilicon, and may be electrically connected to the common source line 319. A first metal layer 350a and a second metal layer 360a may be stacked sequentially on the upper part of the common source line contact plug 380. As an example, a region in which the common source line contact plug 380, the first metal layer 350a, and the second metal layer 360a are placed may be defined as an external pad bonding region PA.

On the other hand, input/output pads 305 may be placed in the external pad bonding region PA.

Referring to FIG. 1, an upper insulation film 301 which covers an upper face of the second substrate 310 may be formed above the second substrate 310, and a second input/output pad 305 may be formed on the upper insulation film 301. The second input/output pad 305 is connected to at least one of a plurality of circuit elements 220a, 220b and 220c placed in the peripheral circuit region PERI through a rear contact plug 303a, a landing pad 302a, a front contact plug 303b, and an upper bonding pad 373. The landing pad 302a may be formed to be spaced apart from the ground selection line 320 in the first direction (X direction). Further, the landing pad 302a may be formed at the same height as the ground selection line 320 in the third direction (Z direction).

The rear contact plug 303a extends in the third direction Z and may be electrically connected to the landing pad 302a. Further, the rear contact plug 303a may penetrate the side insulation layer 313 and be electrically connected to the second input/output pad 305.

In view of this configuration, it is possible to improve alignment margin of the rear input/output contact plug 303a that connects at least one of the plurality of circuit elements 220a, 220b and 220c to the second input/output pad 305, by use of the landing pad 302a. That is, it is possible to improve the yield of the nonvolatile memory device according to some embodiments through the use of the landing pad 302a. The landing pad 302a that improves the alignment margin of the rear input/output contact plug 303a will be explained below in detail with reference to FIGS. 4 to 12.

Figure 4:
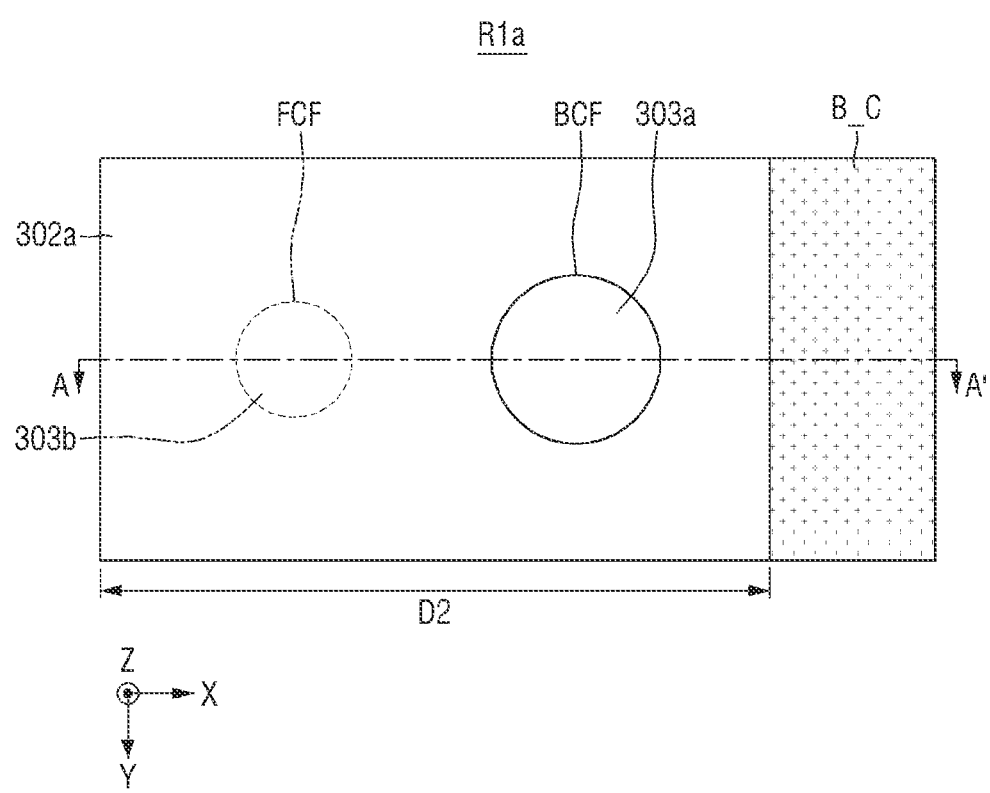
FIG. 4 illustrates a schematic enlarged view of region R1 of FIG. 1 according to embodiments of the inventive concepts.

FIG. 4 illustrates a schematic enlarged view of a region R1 of FIG. 1. For reference, FIG. 4 is a top view of the region R1 of FIG. 1 as viewed in the third direction (Z direction).

Referring to FIGS. 1 and 4, when an exemplary region R ia of the region R1 of the nonvolatile memory device according to some embodiments is viewed in the third direction (Z direction), the landing pad 302a may be formed as having a second length D2 in the first direction (X direction).

The lower face of the landing pad 302a may be connected to the rear input/output contact plug 303a extending in the third direction (Z direction). A portion of the lower face of the landing pad 302a that converges with the rear input/output contact plug 303a may be defined as a rear contact face BCF. The upper face of the landing pad 302a that is opposite the lower face of the landing pad 302a may be connected to a front input/output contact plug 303b extending in the third direction (Z direction). A portion of the upper face of the landing pad 302a that converges with the front input/output contact plug 303b may be defined as a front contact face FCF. A landing pad cut B_C used for forming the landing pad 302a may be placed on the side face of the landing pad 302a.

In the nonvolatile memory device according to some embodiments, the rear contact face BCF and the front contact face FCF do not converge with each other. Hereinafter, the region R1a will be explained in more detail with reference to FIG. 5 which a cross section taken along line A-A' in FIG. 4. However, the nonvolatile memory device according to some embodiments is not limited thereto, and for example, a part of the rear contact face BCF and a part of the front contact face FCF may overlap each other.

Figure 5:
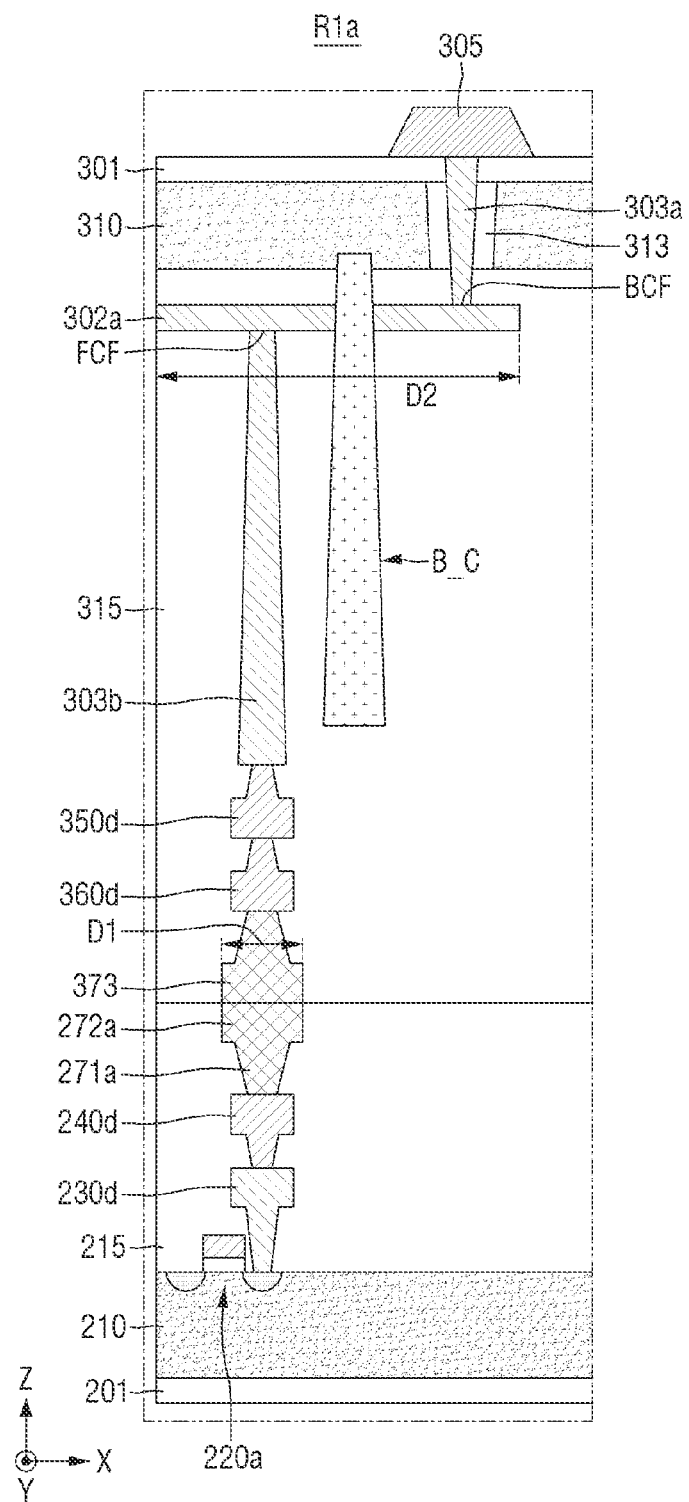
FIG. 5 illustrates an exemplary cross-sectional view taken along line A-A' of FIG. 4.

FIG. 5 illustrates an exemplary cross-sectional view taken along a line A-A' of FIG. 4.

Referring to FIGS. 1 and 5, in the region R1a according to some embodiments, the second input/output pad 305 may be electrically connected to the circuit element 220a through the rear input/output contact plug 303a, the landing pad 302a, the front input/output contact plug 303b and the upper bonding pad 373.

More specifically, the second input/output pad 305 may be electrically connected to the upper bonding pad 373 through the first metal layer 230d, the second metal layer 240d, and the lower bonding metals 271a and 272a that are stacked sequentially from the circuit element 220a in the third direction (Z direction).

Further, the upper bonding pad 373 may be electrically connected to the front contact plug 303b through the first metal layer 350d and the second metal layer 360d.

The alignment margin of the rear input/output contact plug 303a placed so that the second input/output pad 305 is electrically connected to the circuit element 220a may have a second length D2 in the first direction (X direction). The second length D2 is longer than the first length D1 of the upper bonding pad 373 in the first direction (X direction). Therefore, in absence of the landing pad 302a, when the alignment margin for the second input/output pad 305 to be electrically connected to the circuit element 220a is the first length D1, since the alignment margin is very small, the yield of the nonvolatile memory device may be reduced. That is, by forming a landing pad 302a having the second length D2 longer than the first length D1 of the upper bonding pad 373 and including a conductive material, it is possible to improve the alignment margin of the rear input/output contact plug 303a connected to the circuit element 220a of the nonvolatile memory device with the second input/output pad 305 according to embodiments of the inventive concepts. The yield of the nonvolatile memory device according to some embodiments can also be improved accordingly. The second length D2 of the landing pad 302a is not limited to the first direction (X direction). For example, the length of the landing pad 302a in the second direction (Y direction) may be longer than the length of the upper bonding pad 373 in the second direction (Y direction). Or, for example, the area of the landing pad 302a viewed in the third direction (Z direction) may be greater than the area of the upper bonding pad 373 viewed in the third direction (Z direction).

The landing pad 302a of the nonvolatile memory device according to some embodiments may be formed through a replacement process using a sacrificial film. The landing pad cut B_C may be formed through the replacement process. Hereinafter, a method of fabricating a nonvolatile memory device according to some embodiments will be explained by way of an example at the region R1a, referring to FIGS. 6 to 10. FIGS. 6 to 10 illustrate exemplary diagrams explanatory of intermediate steps of the method of fabricating the nonvolatile memory device according to some embodiments. For reference, in order to explain the method of fabricating the nonvolatile memory device according to some embodiments, the drawing of FIG. 5 will be explained upside down. That is, in FIG. 5 upper insulation film 301 is shown at the top of the figure, whereas in FIGS. 6-10 the intermediate structure is flipped over so that upper insulating film 310 is shown at the bottom of the figures.

Figure 6:
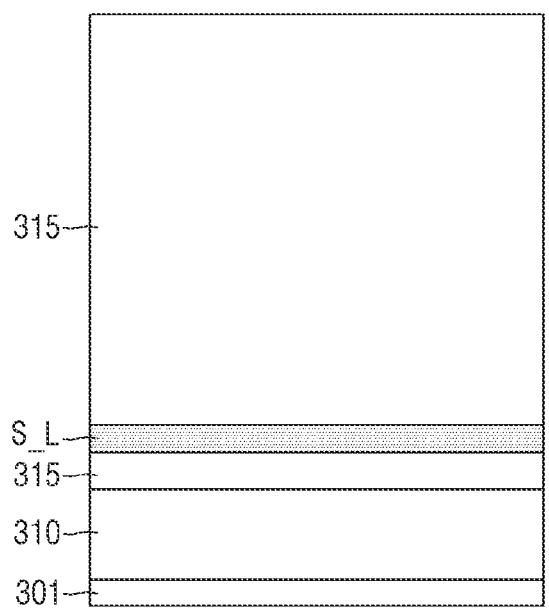
FIGS. 6, 7, 8, 9 and 10 illustrate exemplary diagrams explanatory of intermediate steps of a method of fabricating the nonvolatile memory device according to embodiments of the inventive concepts.

First, referring to FIG. 6, the substrate 310, the interlayer insulation layer 315, the sacrificial film S_L, and the interlayer insulation layer 315 are stacked sequentially on the upper insulation film 301.

The sacrificial film S_L may include, for example, at least one of silicon nitride, silicon oxynitride, silicon-rich nitride and nanocrystalline (Si). For convenience of explanation, hereinafter, the sacrificial film S_L will be described as containing silicon nitride.

The interlayer insulation layer 315 may include an insulating material. The interlayer insulation layer 315 may include, for example, silicon oxides such as BSG (borosilicate Glass), PSG (phosphoSilicate Glass), BPSG (boroPhosphoSilicate Glass), USG (Undoped Silicate Glass), TEOS (TetraEthylOrthoSilicate Glass) or HDP-CVD (High Density Plasma-CVD), but is not limited thereto.

Figure 7:
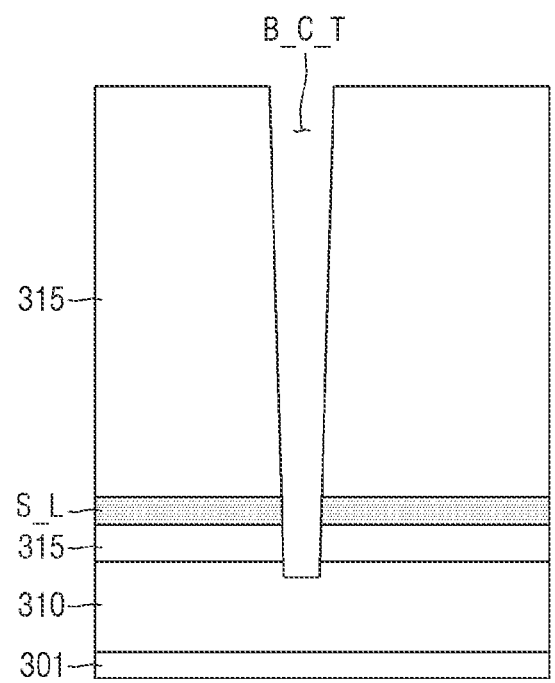

Hereinafter, referring to FIG. 7, a part of the substrate 310, the interlayer insulation layer 315 and the sacrificial film S_L may be etched to form a landing pad cut trench B_C_T.

Figure 8:
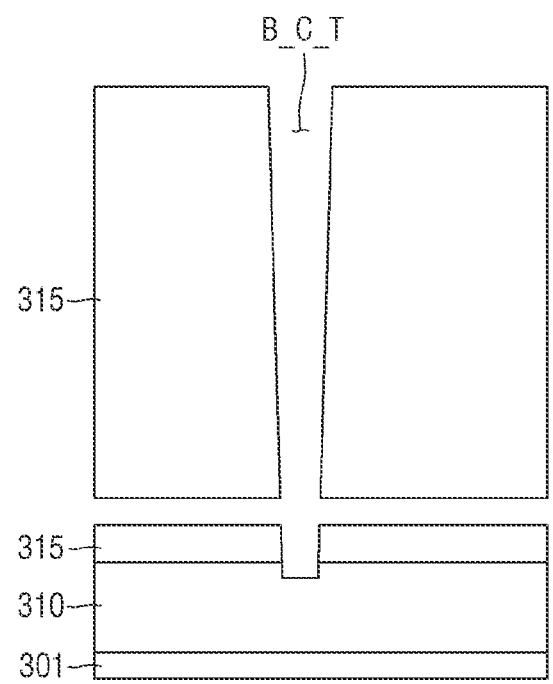

Subsequently, referring to FIG. 8, the sacrificial film S_L is removed. The sacrificial film S_L may be removed through an full back process, using the space of the landing pad cut trench B_C_T. That is, a recess may be formed in a place from which the sacrificial film S_L is removed.

Figure 9:
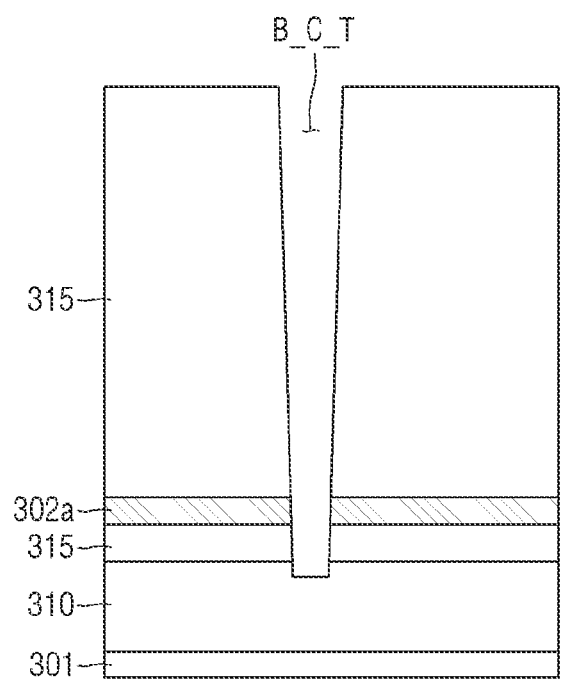

Subsequently, referring to FIG. 9, the recess formed through the full back process may be filled with a conductive material to form a landing pad 302a. The conductive material may include, for example, metals such as tungsten (W), cobalt (Co) and nickel (Ni) or semiconductor materials such as silicon. Also, the conductive material for forming the landing pad 302a may be a material such as a conductive material for forming the ground selection line 320, but is not limited thereto.

Figure 10:
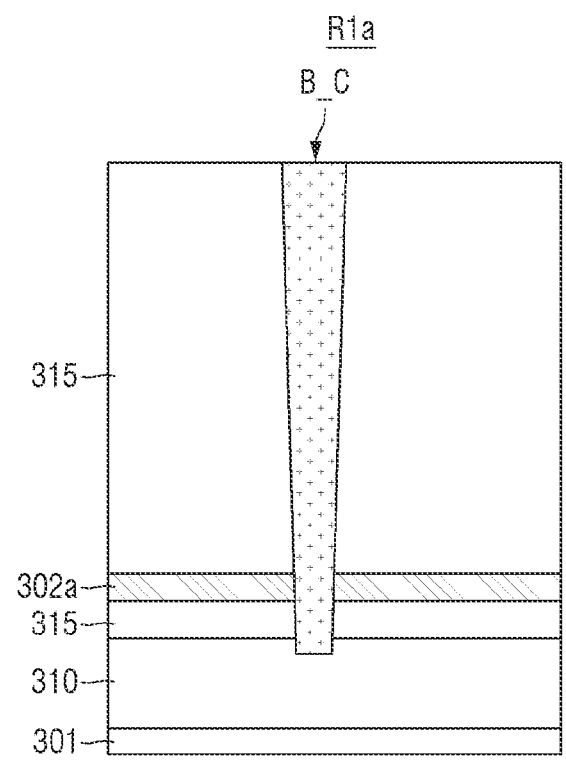

After that, referring to FIG. 10, the landing pad cut trench B_C_T may be filled with an insulating material to form a landing pad cut B_C. The insulating material that forms the landing pad cut B_C may include, for example, silicon oxides such as BSG (borosilicate Glass), PSG (phosphoSilicate Glass), BPSG (boroPhosphoSilicate Glass), USG (Undoped Silicate Glass). TEOS (TetraEthylOrthoSilicate Glass) or HDP-CVD (High Density Plasma-CVD), but is not limited thereto.

After that, the front input/output contact plug 303b and the upper bonding pad 373 extending in the third direction (Z direction) may be formed sequentially and bonded to the lower bonding metal 272a of the peripheral circuit region PERI. After that, the upper insulation film 301 and the interlayer insulation layer 315 are etched to form the rear input/output contact plug 303a to be in contact with the landing pad 302a, and the second input/output pad 305 may be formed on the ear input/output contact plug 303a and the upper insulation film 301 to form the configuration as shown in FIG. 5.

Hereinafter, another example of the region R1 of the nonvolatile memory device of FIG. 1 according to some embodiments will be explained through FIGS. 11 and 12. For reference, repeated explanation of the contents explained above will not be provided, and differences will be mainly explained.

Figure 11:
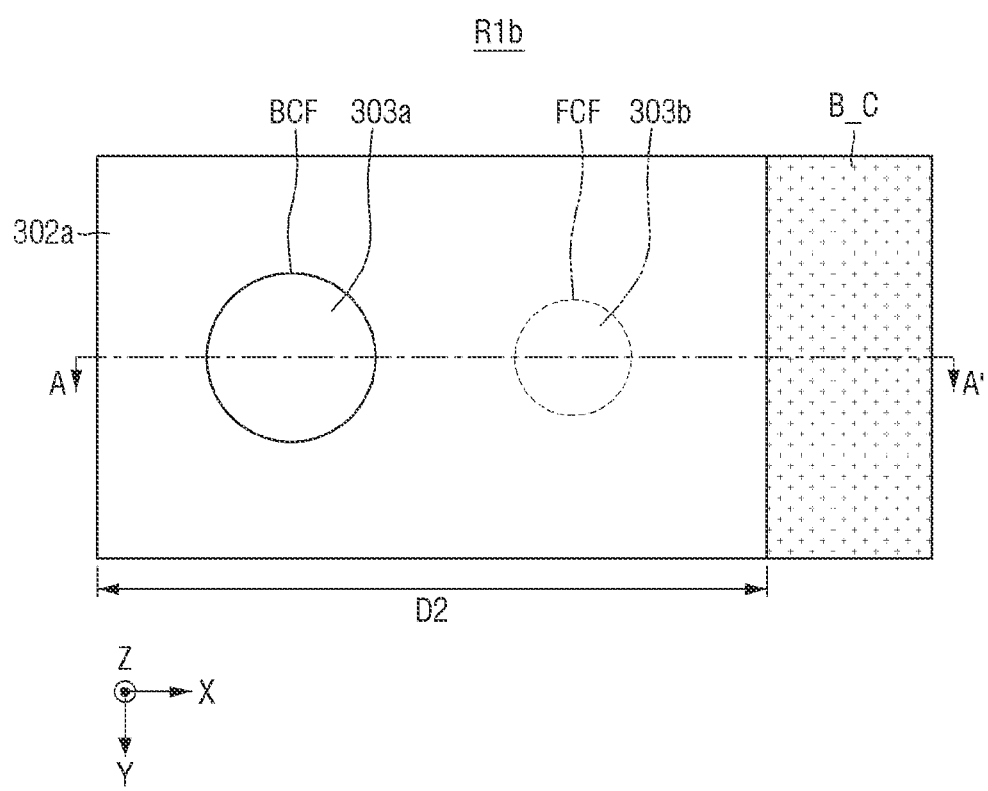
FIG. 11 illustrates an exemplary enlarged view of the region R1 of FIG. 1 according to other embodiments of the inventive concepts.

FIG. 11 illustrates another exemplary enlarged view of the region R1 of FIG. 1. For reference, FIG. 11 is a top view of the region R1 of FIG. 1 as viewed in the third direction (Z direction).

Referring to FIGS. 1 and 11, when an exemplary R1b region of the region R1 of the nonvolatile memory device according to some embodiments is viewed in the third direction (Z direction), the landing pad 302a may be formed as having the second length D2 in the first direction (X direction).

The lower face of the landing pad 302a may be connected to the rear input/output contact plug 303a extending in the third direction (Z direction). A portion of the lower face of the landing pad 302a that converges with the rear input/output contact plug 303a may be defined as a rear contact face BCF. The upper face of the landing pad 302a that is opposite the lower face of the landing pad 302a may be connected to a front input/output contact plug 303b extending in the third direction (Z direction). A portion of the upper face of the landing pad 302a that converges with the front input/output contact plug 303b may be defined as a front contact face FCF. The landing pad cut B_C used for forming the landing pad 302a may be placed on the side face of the landing pad 302a.

In the nonvolatile memory device according to some embodiments, the rear contact face BCF and front contact face FCF do not overlap each other. More specifically, the front contact face FCF and the rear contact face BCF may not overlap each other. Hereinafter, the region R Ib will be explained with reference to FIG. 12 which is a cross section taken along the line A-A' of FIG. 11. However, the nonvolatile memory device according to some embodiments is not limited thereto, and for example may be placed at any position where the rear contact face BCF and the front contact face FCF do not overlap each other.

Figure 12:
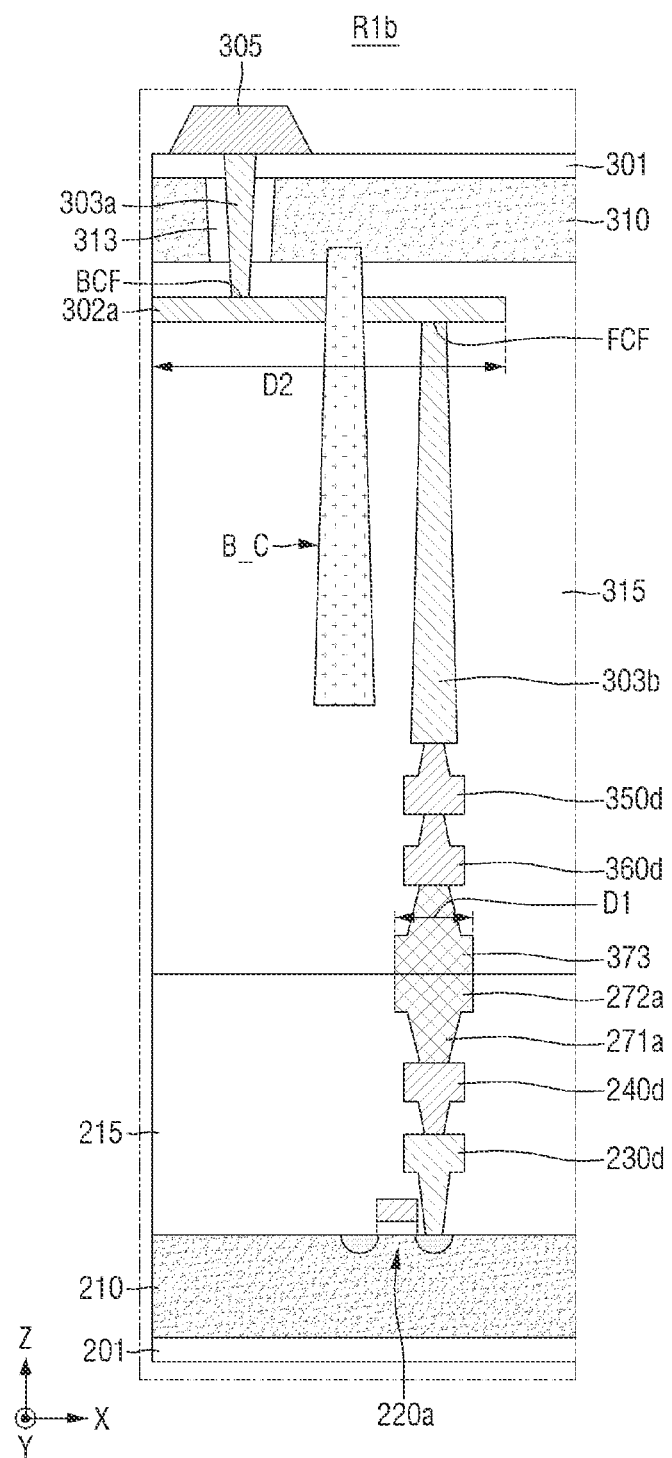
FIG. 12 illustrates an exemplary cross-sectional view taken along a line A-A' in FIG. 11.

FIG. 12 illustrates an exemplary cross-sectional view taken along a line A-A' in FIG. 11.

Referring to FIGS. 1 and 12, in the region R1b according to some embodiments, the second input/output pad 305 may be electrically connected to the circuit element 220a through the rear input/output contact plug 303a, the landing pad 302a, the front input/output contact plug 303b and the upper bonding pad 373.

More specifically, the second input/output pad 305 may be electrically connected to the upper bonding pad 373 through the first metal layer 230d, the second metal layer 240d, and the lower bonding metals 271a and 272a that are stacked sequentially from the circuit element 220a in the third direction (Z direction).

Further, the upper bonding pad 373 may be electrically connected to the front contact plug 303b through the first metal layer 350d and the second metal layer 360d.

The alignment margin of the rear input/output contact plug 303a placed so that the second input/output pad 305 is electrically connected to the circuit element 220a may have the second length D2 in the first direction (X direction). The second length D2 is longer than the first length D1 of the upper bonding pad 373 in the first direction (X direction). Therefore, in absence of the landing pad 302a, when the alignment margin for the second input/output pad 305 to be electrically connected to the circuit element 220a is the first length D1, since the alignment margin is very small, the yield of the nonvolatile memory device may be reduced. That is, by forming the landing pad 302a that has the second length D2 longer than the first length D1 of the upper bonding pad 373 and includes a conductive material, it is possible to improve the alignment margin of the rear input/output contact plug 303a connected to the circuit element 220a with the second input/output pad 305 of the nonvolatile memory device according to embodiments of the inventive concepts. The yield of the nonvolatile memory device according to some embodiments can also be improved accordingly. The second length D2 of the landing pad 302a is not limited to the first direction (X direction). For example, the length of the landing pad 302a in the second direction (Y direction) may be longer than the length of the upper bonding pad 373 in the second direction (Y direction). Or, for example, the area of the landing pad 302a viewed in the third direction (Z direction) may be greater than the area of the upper bonding pad 373 viewed in the third direction (Z direction).

The landing pad 302a of the nonvolatile memory device according to some embodiments may be formed through a replacement process using a sacrificial film. A landing pad cut B_C may be formed through the replacement process. Since the method of fabricating the nonvolatile memory device according to some embodiments is similar to the explanation made with reference to through FIGS. 6 to 10, detailed description thereof will not be provided.

Referring to FIG. 1 again, according to the embodiments, the second input/output pad 305 does not overlap the word lines 380 in the third direction (Z-axis direction). Referring to FIG. 1, the second input/output contact plug 303 is separated from the second substrate 310 in a direction parallel to the upper face of the second substrate 310, and may penetrate the interlayer insulation layer 315 of the cell region CELL and be connected to the second input/output pad 305.

According to some embodiments, the second input/output pad 305 may be selectively formed. As an example, a nonvolatile memory device 400a according to some embodiments may include only a second input/output pad 305 located above the second substrate 310.

A metal pattern of the uppermost metal layer exists as a dummy pattern in each of the external pad bonding region PA and the bit line bonding region BLBA included in the cell region CELL and the peripheral circuit region PERI, or the uppermost metal layer may be emptied.

In the nonvolatile memory device 400a according to some embodiments, a lower metal pattern 273a having the same shape as the upper metal pattern 372a of the cell region CELL may be formed in the uppermost metal layer of the peripheral circuit region PERI to correspond to the upper metal pattern 372a formed in the uppermost metal layer of the cell region CELL, in the external pad bonding region PA. The lower metal pattern 276a formed in the uppermost metal layer of the peripheral circuit region PERI may not be connected to another contact in the peripheral circuit region PERI. Similarly, an upper metal pattern having the same shape as the lower metal pattern of the peripheral circuit region PERI may be formed in the upper metal layer of the cell region CELL to correspond to the lower metal pattern formed in the uppermost metal layer of the peripheral circuit region PERI, in the external pad bonding region PA.

Lower bonding metals 271b and 272b may be formed on the second metal layer 240b of the word line bonding region WLBA. In the word line bonding region WLBA, the lower bonding metals 271b and 272b of the peripheral circuit region PERI may be electrically connected to the upper bonding metals 371b and 372b of the cell region CELL in the bonding way.

Further, in the bit line bonding region BLBA, an upper metal pattern 392 having the same shape as the lower metal pattern 252 of the peripheral circuit region PERI may be formed in the uppermost metal layer of the cell region CELL to correspond to the lower metal pattern 252 formed on the uppermost metal layer of the peripheral circuit region PERI. Lower metal pattern 251 may be connected to upper metal pattern 252. No contact may be formed on the upper metal pattern 392 formed in the uppermost metal layer of the cell region CELL.

Figure 13:
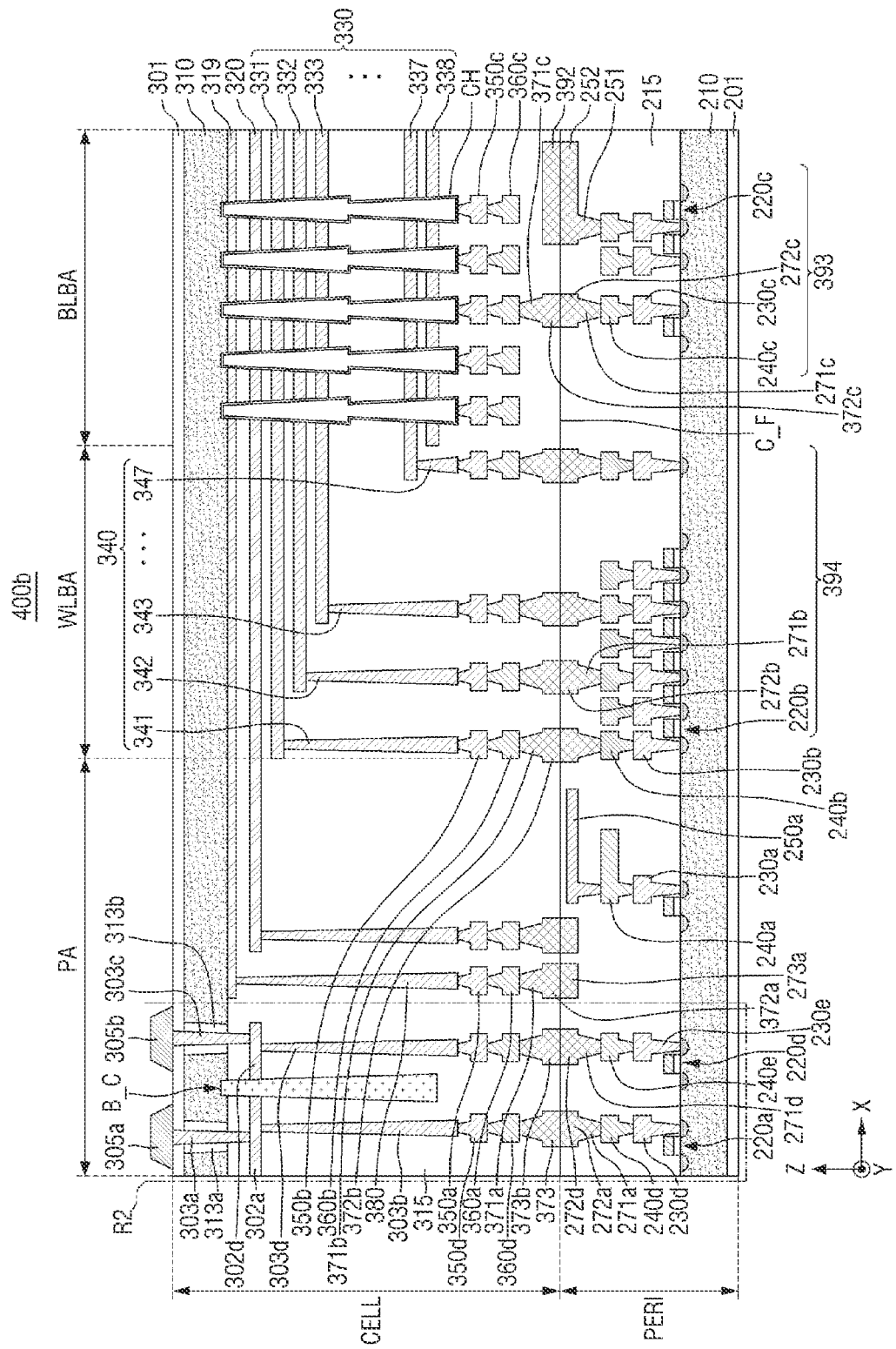
FIG. 13 illustrates an exemplary diagram of a nonvolatile memory device according to embodiments of the inventive concepts.

FIG. 13 illustrates an exemplary diagram showing another nonvolatile memory device according to some embodiments of the inventive concepts. Hereinafter, repeated explanation of the contents explained above will not be provided, and aspects different from the nonvolatile memory device 400a of FIG. 1 will be mainly explained.

Referring to FIG. 13, unlike the nonvolatile memory device 400a according to some embodiments of FIG. 1, a nonvolatile memory device 400b according to some embodiments may include a plurality of second input/output pads 305a and 305b, a plurality of rear input/output contact plugs 303a and 303c, a plurality of landing pads 302a and 302b, a plurality of front input/output contact plugs 303b and 303d, a plurality of upper bonding pads 373 and 373b, a plurality of lower bonding metals 272a, 271a, 272d and 271d, a plurality of second metal layers 240d and 240e, a plurality of first metal layers 230d and 230e, and a plurality of circuit elements 220a and 220d, in the external pad bonding region PA.

More specifically, the second input/output pad 305a may be electrically connected to the circuit element 220a through the rear input/output contact plug 303a, the landing pad 302a, the front input/output contact plug 303b, and the upper bonding pad 373. Also, the second input/output pad 305b may be electrically connected to the circuit element 220d through the rear input/output contact plug 303c, the landing pad 302b, the front input/output contact plug 303d, and the upper bonding pad 373b.

A plurality of landing pads 302a and 302b may be formed through a landing pad cut B_C, and the nonvolatile memory device 400b according to some embodiments may improve the alignment margins of each of the plurality of rear input/output contact plugs 303a and 303c through each of the plurality of landing pads 302a and 302b. The yield of the nonvolatile memory device 400b according to some embodiments can also be improved accordingly.

Figure 14:
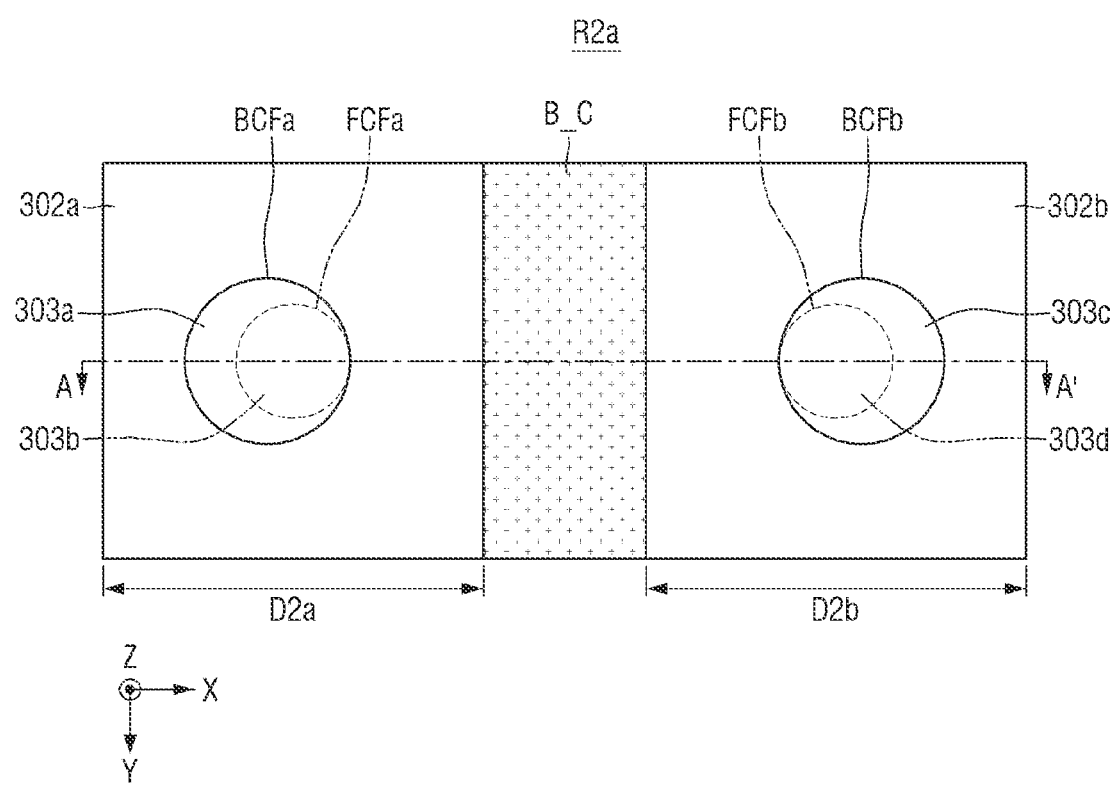
FIG. 14 illustrates an enlarged schematic view of the region R2 of FIG. 13 according to embodiments of the inventive concepts.

FIG. 14 illustrates an enlarged schematic view of the region R2 of FIG. 13. For reference, FIG. 14 is a top view of the region R2 of FIG. 13 as viewed in the third direction (Z direction).

Referring to FIGS. 13 and 14, when an exemplary region R2a of the region R2 of the nonvolatile memory device according to some embodiments is viewed in the third direction (Z direction), the landing pads 302a and 302b may be formed as having a third length D2a and a fourth length D2b in the first direction (X direction), respectively.

The lower faces of the plurality of landing pads 302a and 302b may be connected to the plurality of rear input/output contact plugs 303a and 303c extending in the third direction (Z direction). Portions of the lower face of the landing pad 302a and the lower face of the landing pad 302b which respectively converge with the plurality of rear input/output contact plugs 303a and 303c may be defined as rear contact faces BCFa and BCFb. The upper faces of the landing pads 302a and 302b that are respectively opposite the lower faces of the plurality of landing pads 302a and 302b may be respectively connected to the plurality of front input/output contact plugs 303b and 303d extending in the third direction (Z direction). Portions of the upper face of the landing pad 302a and the upper face of the landing pad 302b face which respectively converge with the plurality of front input/output contact plugs 303b and 303d may be defined as the front contact faces FCFa and FCFb. A landing pad cut B_C used to form the plurality of landing pads 302a and 302b may be placed between the plurality of landing pads 302a and 302b.

In the nonvolatile memory device according to some embodiments, the rear contact faces BCFa and BCFb and the front contact faces FCFa and FCFb may each respectively overlap each other. More specifically, each of the front contact faces FCFa and FCFb may respectively be included in the rear contact faces BCFa and BCFb along the third direction (Z direction). Hereinafter, the region R2a will be explained in detail with reference to FIG. 15 which is a cross section taken along line A-A' of FIG. 14. However, it should be understood that in other embodiments at least a part of each of the rear contact faces BCFa and BCFb and a part of each of the front contact faces FCFa and FCFb may overlap each other.

Figure 15:
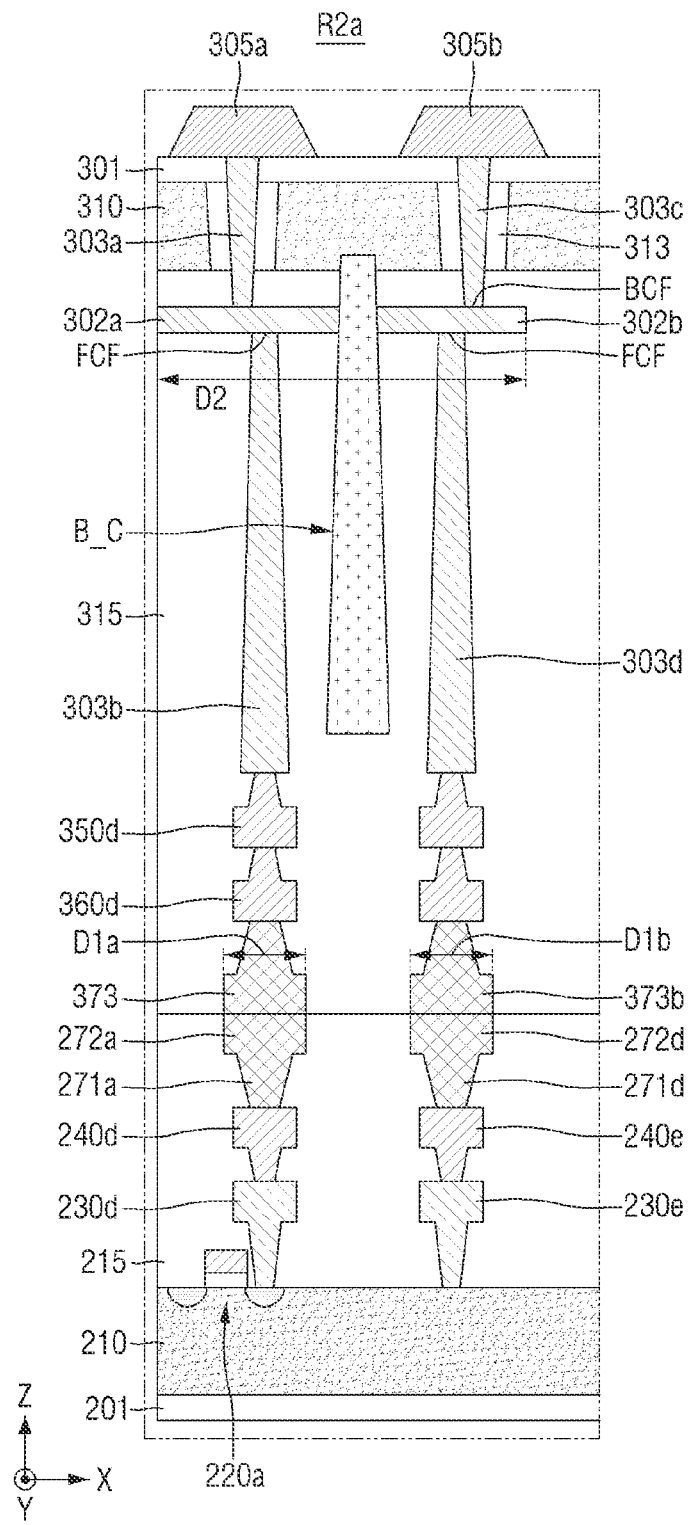
FIG. 15 illustrates an exemplary cross-sectional view taken along a line A-A' of FIG. 14.

FIG. 15 illustrates an exemplary cross-sectional view taken along a line A-A' of FIG. 14.

Referring to FIGS. 13 and 15, the plurality of second input/output pads 305a and 305b may be electrically connected to the respective circuit elements 220a and 220b through the plurality of rear input/output contact plugs 303a and 303c, the plurality of landing pads 302a and 302b, the plurality of front input/output contact plugs 303b and 303d, and the plurality of upper bonding pads 373 and 373b, in the region R2a according to some embodiments.

More specifically, the plurality of second input/output pads 305a and 305b may be electrically connected to the plurality of upper bonding pads 373 and 373b through the first metal layers 230d and 230e, the second metal layers 240d and 240e, and the lower bonding metals 271a, 272a, 271d and 272d, which are stacked sequentially from each of the circuit elements 220a and 220b in the third direction (Z direction).

The plurality of landing pads 302a and 302b of the nonvolatile memory device according to some embodiments may be formed through a replacement process using a sacrificial film. A landing pad cut B_C may be formed through the replacement process. Hereinafter, since the method for fabricating the nonvolatile memory device according to some embodiments is similar to the explanation of FIGS. 6 to 10 described above, the explanation thereof will not be provided.

Figure 16:
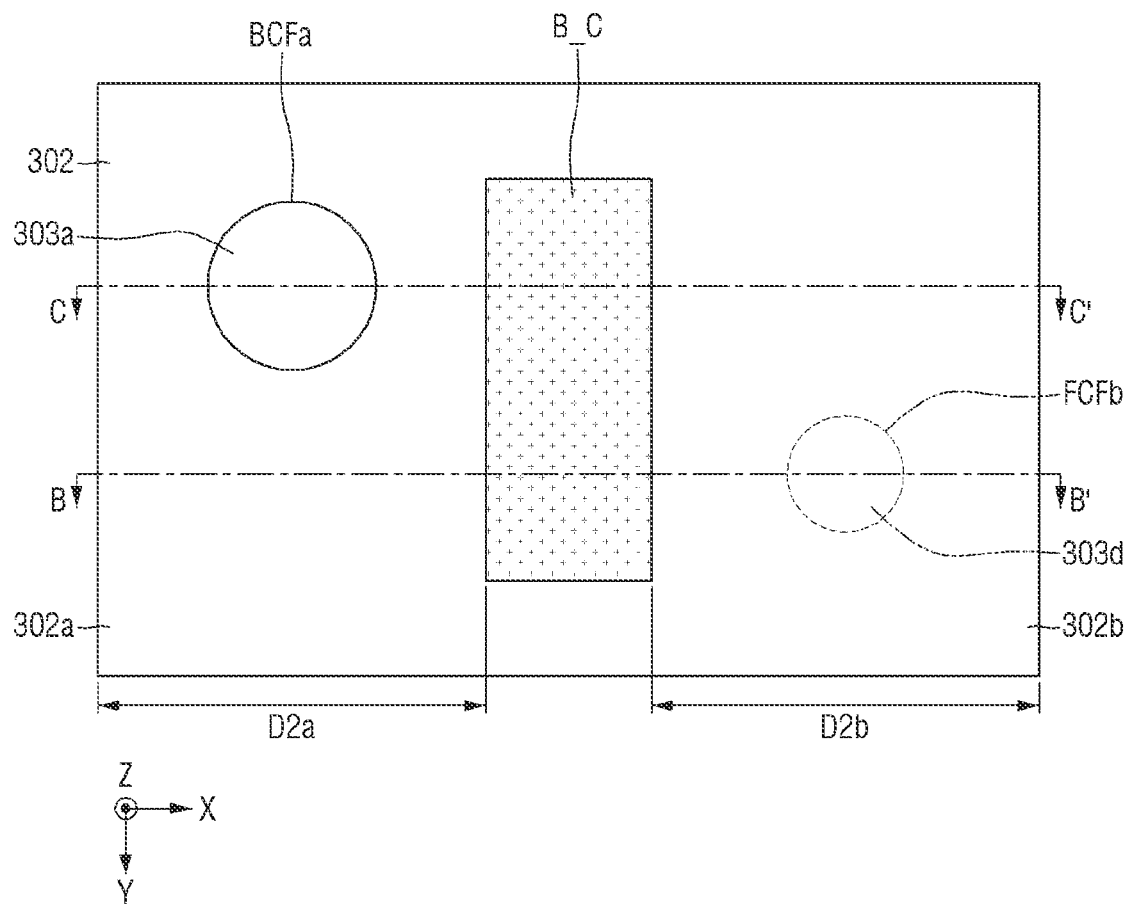
FIG. 16 illustrates an exemplary enlarged view of the region R2 of FIG. 14 according to other embodiments of the inventive concepts.

FIG. 16 illustrates another exemplary enlarged view of the region R2 of FIG. 14. For reference, FIG. 16 is a top view of the region R2 of FIG. 13 as viewed in the third direction (Z direction). That is, the region R2b of FIG. 16 may replace the region R2 of FIG. 13.

Referring to FIGS. 13 and 16, when an exemplary region R2b of the region R2 of the nonvolatile memory device according to some embodiments is viewed in the third direction (Z direction), the landing pads 302a and 302b (see FIG. 13) may have a connected shape (see FIG. 16) due to a replacement process through the landing pad cut B_C. Therefore, the landing pads 302a and 302b may form a single landing pad 302 as shown in FIG. 16. The landing pads 302a and 302b of the nonvolatile memory device according to some embodiments may be formed as having a third length D2a and a fourth length D2b in the first direction (X direction), respectively. The shape of the landing pad 302 is not limited thereto, and may have an elliptical shape.

The lower face of the landing pad 302 may be connected to the rear input/output contact plug 303a extending in the third direction (Z direction). A portion of the lower face of the landing pad 302 that converges with the rear input/output contact plug 303a may be defined as the rear contact face BCFa. The upper face of the landing pad 302 that is opposite the lower face of the landing pad 302 may be connected to the front input/output contact plug 303d extending in the third direction (Z direction). A portion of the upper face of the landing pad 302 that converges with the front input/output contact plug 303d may be defined as a front contact face FCFb. The landing pad cut B_C used to form the landing pad 302 may be placed at the center of the landing pad 302.

In the nonvolatile memory device of some embodiments, the rear contact face BCFa and the front contact face FCFb do not overlap each other. More specifically, the front contact face FCFb may not overlap the rear contact face BCFa. Hereinafter, the region R2b will be explained in detail with reference to FIG. 17 which shows a cross section taken along line B-B' of FIG. 16. The region R2b will be further explained in detail with reference to FIG. 18 which shows a cross section taken along line C-C' of FIG. 16. The nonvolatile memory device according to some embodiments is not limited thereto, and may be placed, for example, at any position where the rear contact face BCFa and the front contact face FCFb do not overlap each other.

Figure 17:
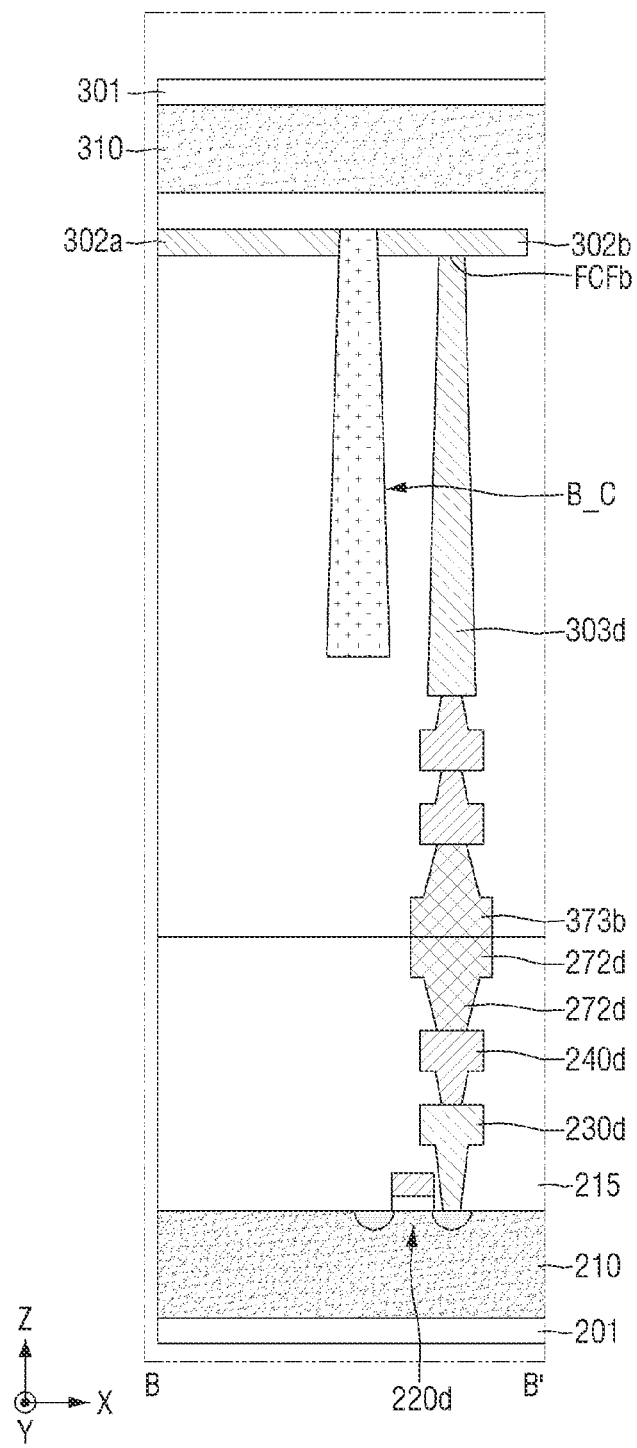
FIG. 17 illustrates an exemplary cross-sectional view taken along a line B-B' of FIG. 16.
Figure 18:
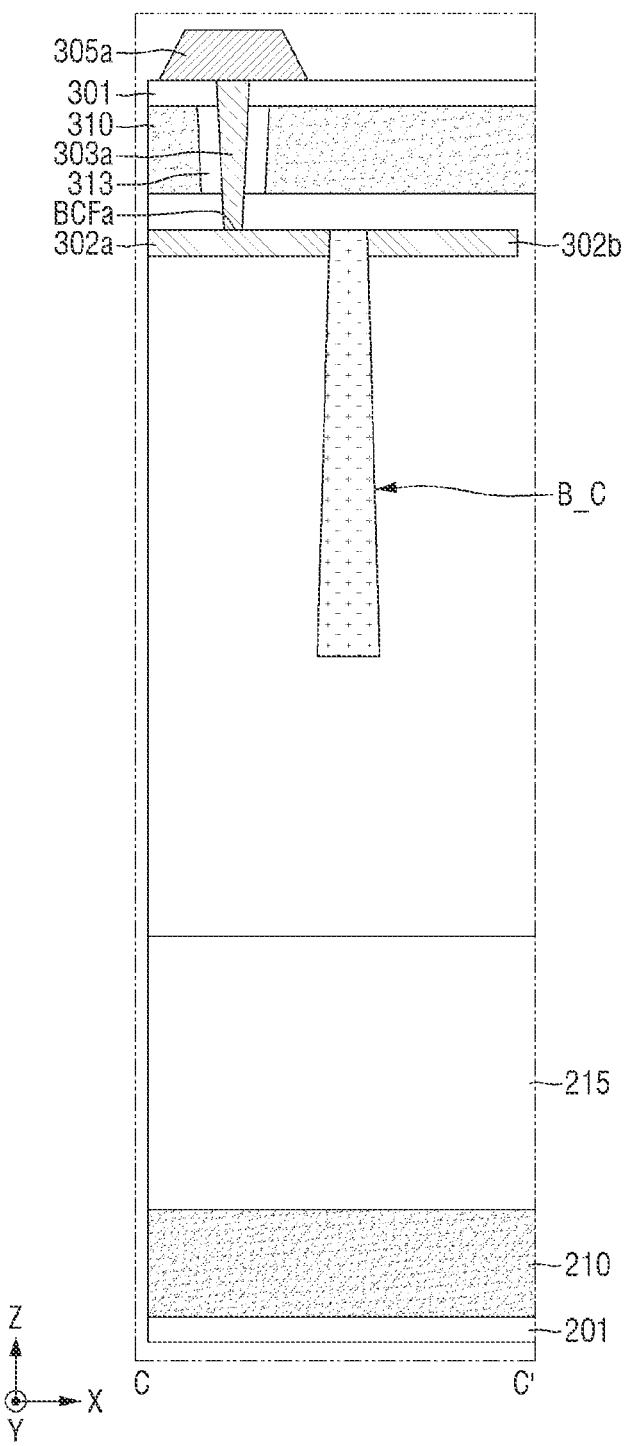
FIG. 18 illustrates an exemplary cross-sectional view taken along a line C-C' of FIG. 16.

FIG. 17 illustrates an exemplary cross-sectional view taken along a line B-B' of FIG. 16. FIG. 18 illustrates an exemplary cross-sectional view taken along a line C-C' of FIG. 16.

Referring to FIG. 17, the circuit element 220d, the front input/output contact plug 303d and the landing pad 302b may be electrically connected to each other.

Referring to FIG. 18, the second input/output pad 305a, the rear input/output contact plug 303a and the landing pad 302a may be electrically connected to each other.

That is, the second input/output pad 305a may be electrically connected to the circuit element 220d through the landing pad 302.

Figure 19:
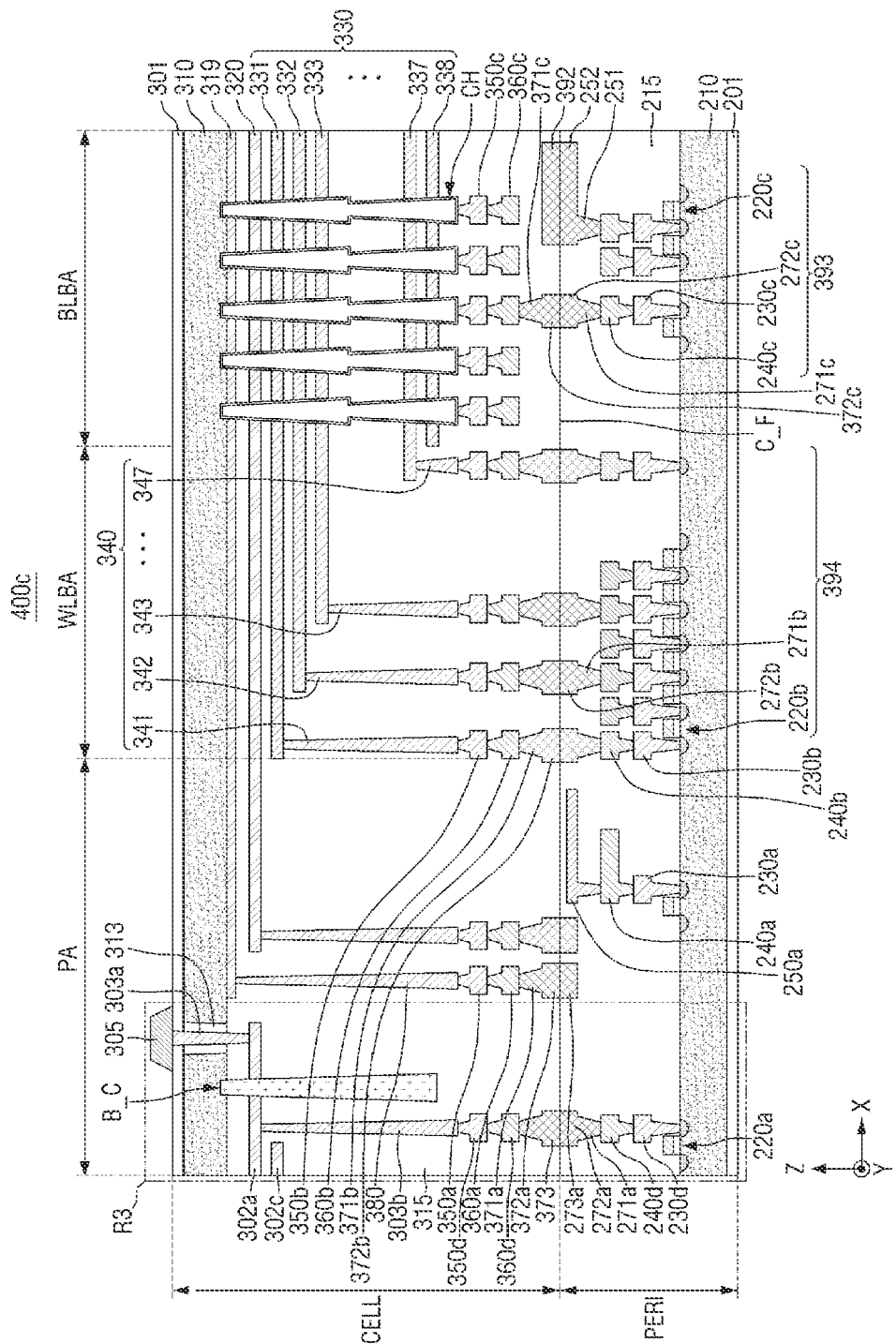
FIG. 19 illustrates an exemplary diagram of a nonvolatile memory device according to embodiments of the inventive concepts.
Figure 20:
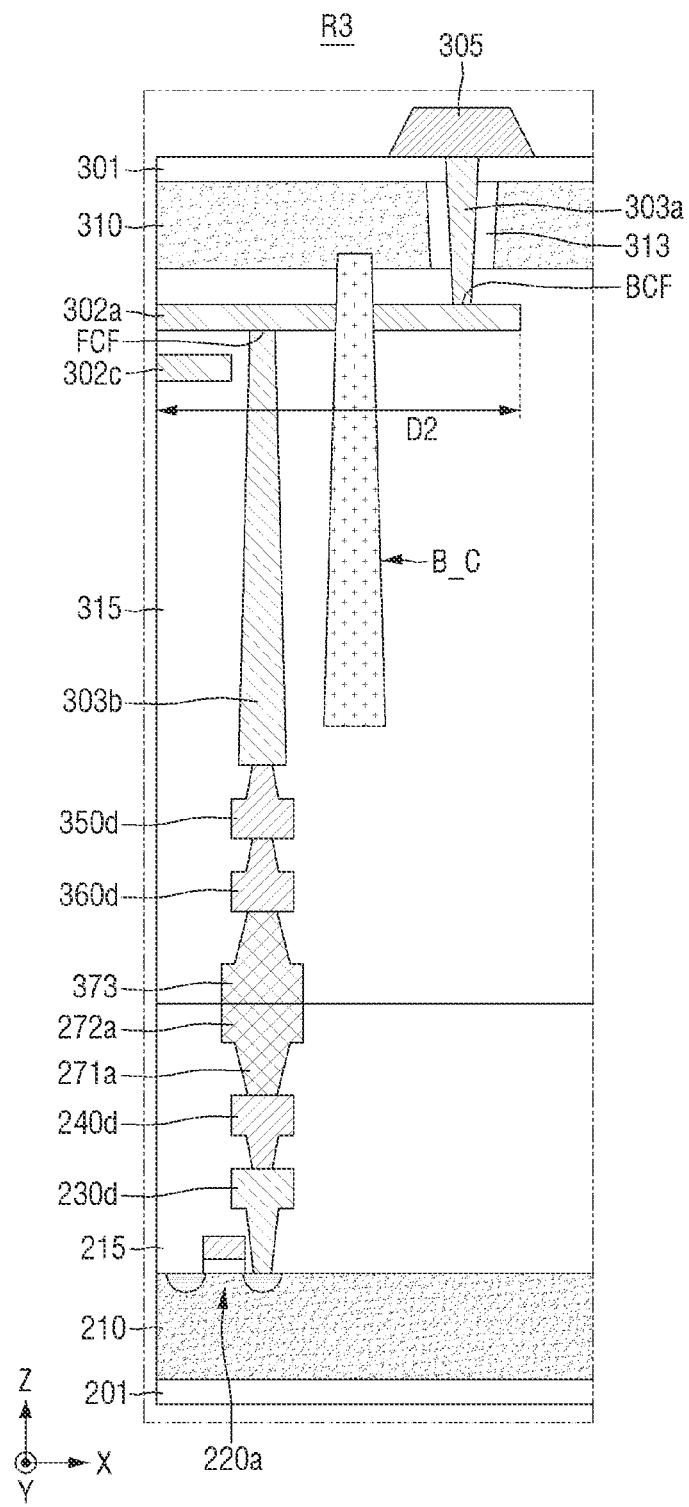
FIG. 20 illustrates an enlarged schematic cross-sectional view of a region R3 of FIG. 19.

FIG. 19 illustrates an exemplary diagram showing another nonvolatile memory device according to some embodiments. FIG. 20 illustrates an enlarged schematic cross-sectional view of a region R3 of FIG. 19.

Referring to FIGS. 19 and 20, unlike the nonvolatile memory device 400a of FIG. 1 according to some embodiments, a nonvolatile memory device 400c according to some embodiments may further include a landing pad 302c formed at the same height as the word line 331, in addition to the landing pad 302a formed at the same height as the ground selection line 320.

The nonvolatile memory device according to some embodiments is not limited thereto, and may further include landing pads formed at the same height as other word lines 332 to 338. For example, four (or more) landing pads may be disposed separate from each other along the third direction (Z direction). In still another example, the nonvolatile memory device according to some embodiments is not limited thereto, and may further include string selection lines placed above and below the word lines 330 and/or landing pads formed at the same height as the ground selection line. In still further embodiments, four (or more) landing pads may be disposed separate from each other along the first direction (X direction).

Figure 21:
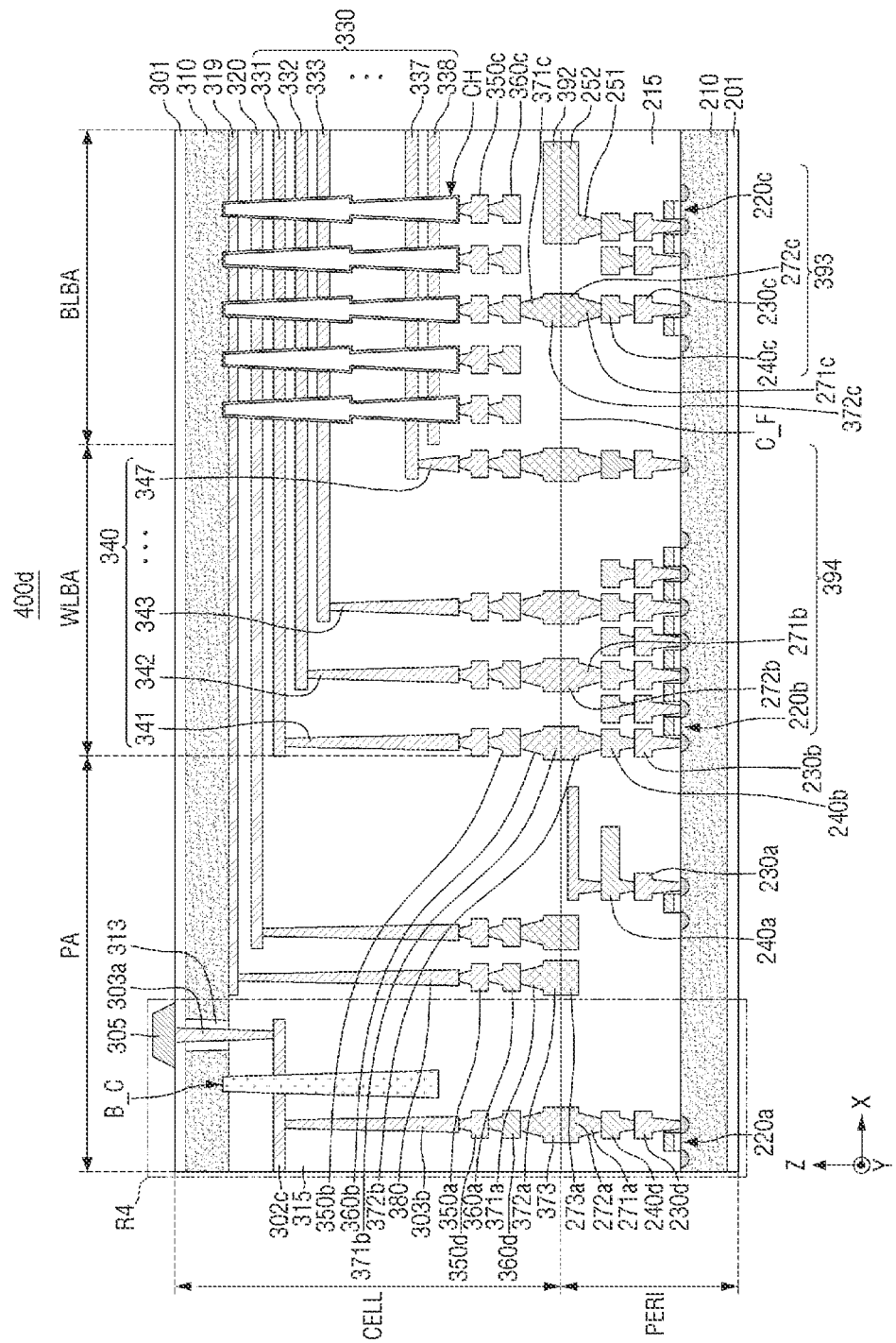
FIG. 21 illustrates an exemplary diagram of a nonvolatile memory device according to embodiments of the inventive concepts.

FIG. 21 illustrates an exemplary diagram showing another nonvolatile memory device according to some embodiments.

Referring to FIG. 21, unlike the nonvolatile memory device 400a of FIG. 1, a nonvolatile memory device 400d according to some embodiments may have a landing pad 302c formed at the same height as the word line 331.

The nonvolatile memory device according to some embodiments is not limited thereto, and the landing pad may be formed at the same height as other word lines 332 to 338. In still another example, the nonvolatile memory device according to some embodiments is not limited thereto, and the landing pad may also be formed at the same height as the string selection lines and/or the ground selection line placed above and below the word lines 330.

Figure 22:
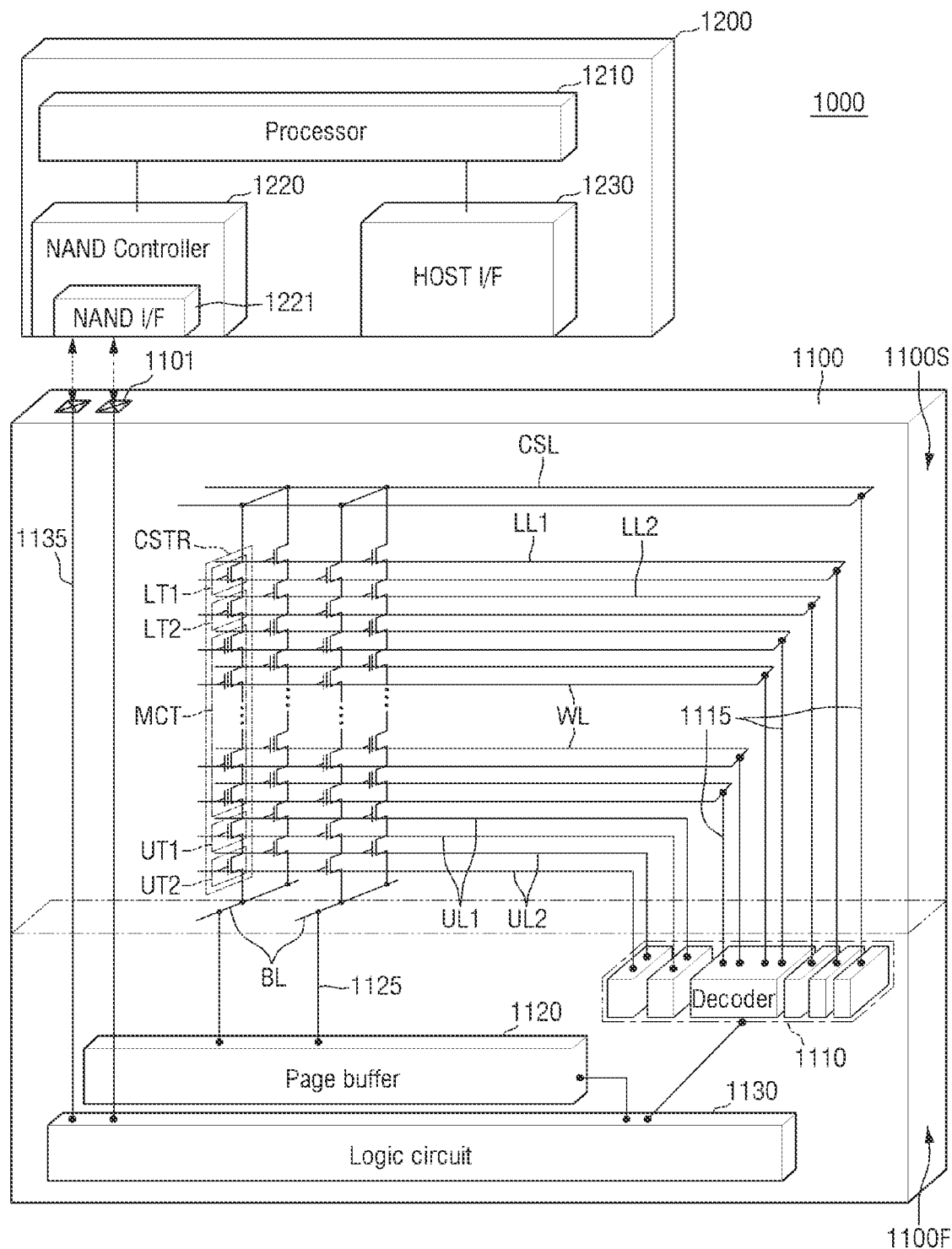
FIG. 22 illustrates an exemplary block diagram of a nonvolatile memory system including a nonvolatile memory device according to embodiments of the inventive concepts.

FIG. 22 illustrates an exemplary block diagram showing a nonvolatile memory system including a nonvolatile memory device according to some embodiments.

Referring to FIG. 22, a nonvolatile memory system 1000 according to some embodiments may include a semiconductor device 1100, and a controller 1200 that is electrically connected to the semiconductor device 1100. The nonvolatile memory system 1000 may be a storage device that includes a single or multiple semiconductor devices 1100, or an electronic device that includes the storage device. For example, the nonvolatile memory system 1000 may be an SSD device (solid state drive device), a USB (Universal Serial Bus), a computing system, a medical device or a communication device including a single or multiple semiconductor devices 1100.

The semiconductor device 1100 may be a nonvolatile memory device, and may be, for example, a NAND flash memory device described with reference to FIGS. 1 to 21. The semiconductor device 1100 may include a first structure 1100F, and a second structure 1100S on the first structure 1100F. In exemplary embodiments, the first structure 1100F may be placed next to the second structure 1100S. The first structure 1100F may be a peripheral circuit structure which includes a decoder circuit 1110, a page buffer 1120, and a logic circuit 1130. The second structure 1100S may be a memory cell structure which includes bit lines BL, a common source line CSL, word lines WL, first and second gate upper lines UL1 and UL2, first and second gate lower lines LL1 and LL2, and memory cell strings CSTR between the bit lines BL and the common source line CSL.

In the second structure 1100S, each memory cell string CSTR may include lower transistors LT1 and LT2 adjacent to the common source line CSL, upper transistors UT1 and UT2 adjacent to the bit line BL, and a plurality of memory cell transistors MCT placed between the lower transistors LT1 and LT2 and the upper transistors UT1 and UT2. The number of lower transistors LT1 and LT2 and the number of upper transistors UT1 and UT2 may be varied according to the embodiments.

In the exemplary embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistor MCT, and the gate upper lines UL1 and UL2 may be the gate electrodes of the upper transistors UT1 and UT2, respectively.

In the exemplary embodiments, the lower transistors LT1 and LT2 may respectively include a lower erasure control transistor LT1 and a ground selection transistor LT2 which are serially connected to each other. The upper transistors UT1 and UT2 may respectively include a string selection transistor UT1 and an upper erasure control transistor UT2 which are serially connected to each other. At least one of the lower erasure control transistor LT1 and the upper erasure control transistor UT1 may be used in an erasure operation for deleting the data stored in the memory cell transistor MCT, using a gate induce drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 that extend from the inside of the first structure 1100F to the second structure 1100S. The bit lines BL may be electrically connected to the page buffer 1120 through second connection wirings 1125 that extend from the inside of the first structure 1100F to the second structure 1100S.

In the first structure 1100F, the decoder circuit 1110 and the page buffer 1120 may perform a control operation on at least one selected memory cell transistor among a plurality of memory cell transistors MCT. The decoder circuit 1110 and the page buffer 1120 may be controlled by the logic circuit 1130. The semiconductor device 1100 may communicate with the controller 1200 through input/output pad(s) 1101 that is electrically connected to the logic circuit 1130. The input/output pad 1101 may be electrically connected to the logic circuit 1130 through the input/output connection wiring 1135 that extends from the inside of the first structure 1100F to the second structure 1100S.

The controller 1200 may include a processor 1210, a NAND controller 1220, and a host interface (I/F) 1230. According to the embodiments, the nonvolatile memory system 1000 may include a plurality of semiconductor devices 1100, and in this case, the controller 1200 may control a plurality of semiconductor devices 1100.

The processor 1210 may control the operation of the entire nonvolatile memory system 1000 including the controller 1200. The processor 1210 may operate according to predetermined firmware, and may control the NAND controller 1220 to access the semiconductor device 1100. The NAND controller 1220 may include a NAND interface (I/F) 1221 that processes communication with the semiconductor device 1100. Control commands for controlling the semiconductor device 1100, data to be recorded in the memory cell transistors MCT of the semiconductor device 1100, data read from the memory cell transistors MCT of the semiconductor device 1100, and the like may be transmitted through the NAND interface 1221. The host interface 1230 may provide a communication function between the nonvolatile memory system 1000 and an external host. When receiving the control commands from an external host through the host interface 1230, the processor 1210 may control the semiconductor device 1100 in response to the control command.

Figure 23:
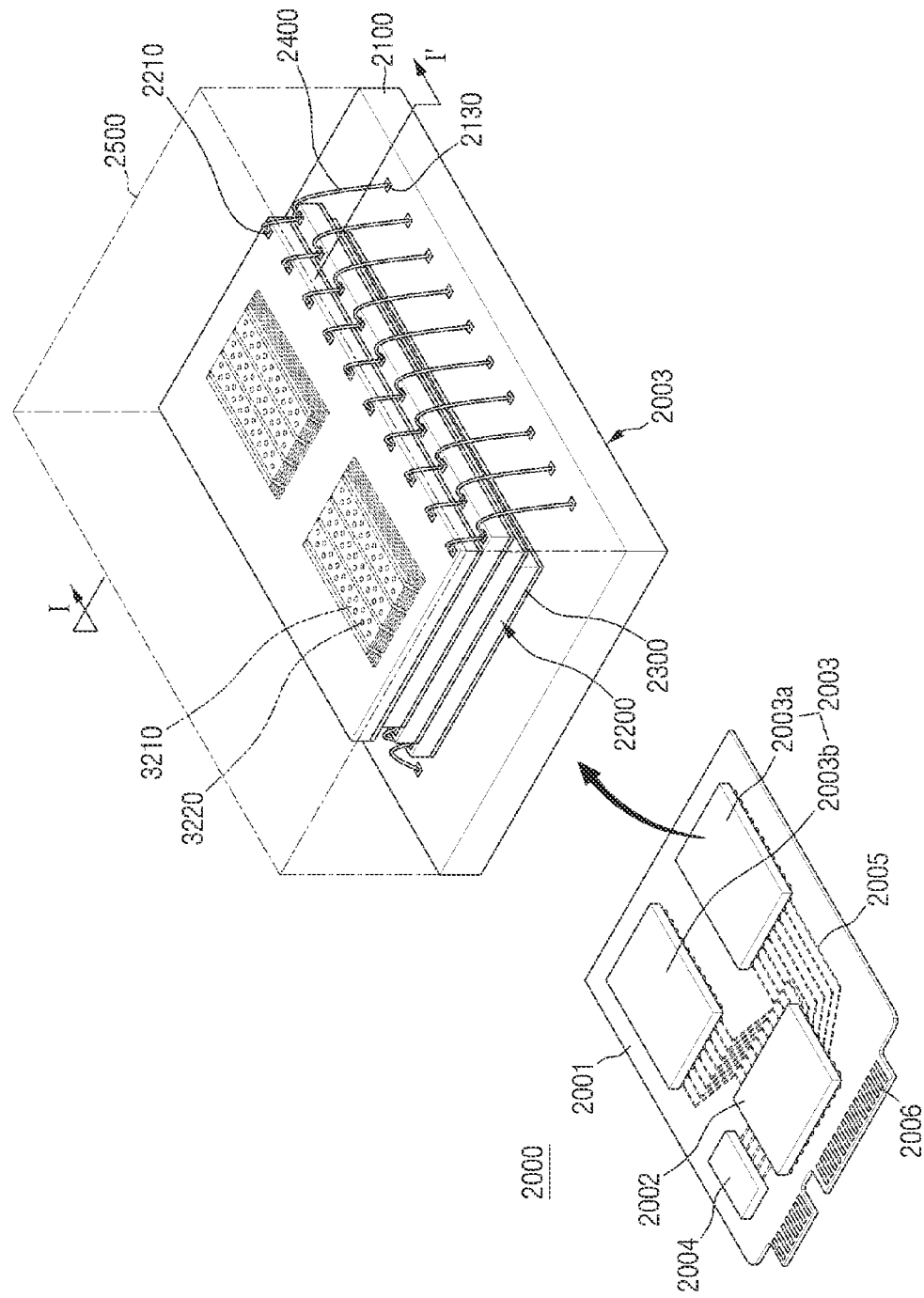
FIG. 23 illustrates an exemplary perspective view of a nonvolatile memory system including the nonvolatile memory device according to embodiments of the inventive concepts.

FIG. 23 illustrates an exemplary perspective view showing a nonvolatile memory system including the nonvolatile memory device according to some embodiments.

Referring to FIG. 23, a nonvolatile memory system 2000 according to some embodiments may include a main board 2001, a controller 2002 mounted on the main board 2001, one or more nonvolatile memory packages 2003, and a DRAM 2004. The nonvolatile memory package 2003 and the DRAM 2004 may be connected to the controller 2002 by wiring patterns 2005 formed on the main board 2001.

The main board 2001 may include a connector 2006 including a plurality of pins coupled to an external host. In the connector 2006, the number and arrangement of the plurality of pins may vary depending on the communication interface between the nonvolatile memory system 2000 and the external host. In exemplary embodiments, the nonvolatile memory system 2000 may communicate with the external host according to any one of interfaces such as M-Phy for USB (Universal Serial Bus), PCI-Express (Peripheral Component Interconnect Express), SATA (Serial Advanced Technology Attachment), and UFS (Universal Flash Storage). In the exemplary embodiments, the nonvolatile memory system 2000 may be operated by power supplied from an external host through the connector 2006. The nonvolatile memory system may further include a PMIC (Power Management Integrated Circuit) that distributes power supplied from the external host to the controller 2002 and the nonvolatile memory package 2003.

The controller 2002 may record data in the nonvolatile memory package 2003 or read data from the nonvolatile memory package 2003, and may improve the operating speed of the nonvolatile memory system 2000.

The DRAM 2004 may be a buffer memory for reducing a speed difference between the nonvolatile memory package 2003 which is a data storage space and the external host. The DRAM 2004 included in the nonvolatile memory system 2000 may also operate as a kind of cache memory, and may provide a space for temporarily storing data in a control operation of the nonvolatile memory package 2003. When the DRAM 2004 is included in the nonvolatile memory system 2000, the controller 2002 may further include a DRAM controller for controlling the DRAM 2004, in addition to the NAND controller for controlling the nonvolatile memory package 2003.

The nonvolatile memory package 2003 may include first and second nonvolatile memory packages 2003a and 2003b that are spaced apart from each other. The first and second nonvolatile memory packages 2003a and 2003b may be nonvolatile memory packages each including a plurality of semiconductor chips 2200. Each of the first and second nonvolatile memory packages 2003a and 2003b may include a package substrate 2100, semiconductor chips 2200 on the package substrate 2100, adhesive layers 2300 placed on a lower face of each semiconductor chip 2200, a connection structure 2400 that electrically connects the semiconductor chips 2200 and the package substrate 2100, and a molding layer 2500 which covers the semiconductor chips 2200 and the connection structure 2400 on the package substrate 2100.

The package substrate 2100 may be a printed circuit substrate that includes package upper pads 2130. Each semiconductor chip 2200 may include an input/output pad 2210. The input/output pad 2210 may correspond to the input/output pad 1101 of FIG. 22. Each of the semiconductor chips 2200 may include word lines 3210 and channel structures 3220. Each of the semiconductor chips 2200 may include a semiconductor device described with reference to FIGS. 1 to 21.

In exemplary embodiments, the connection structure 2400 may be a bonding wire that electrically connects the input/output pad 2210 to the package upper pads 2130. Therefore, in each of the first and second nonvolatile memory packages 2003a and 2003b, the semiconductor chips 2200 may be electrically connected to each other in the bonding wire way, and may be electrically connected to the package upper pads 2130 of the package substrate 2100. According to the embodiments, in each of the first and second nonvolatile memory packages 2003a and 2003b, the semiconductor chips 2200 may also be electrically connected to each other by a connection structure including a through silicon via (TSV), in place of the bonding wire type connection structure 2400.

In exemplary embodiments, the controller 2002 and the semiconductor chips 2200 may also be included in a single package. In an exemplary embodiment, the controller 2002 and the semiconductor chips 2200 mounted on a separate interposer substrate different from the main board 2001, and the controller 2002 and the semiconductor chips 2200 may also be connected to each other by wiring formed on the interposer substrate.

Figure 24:
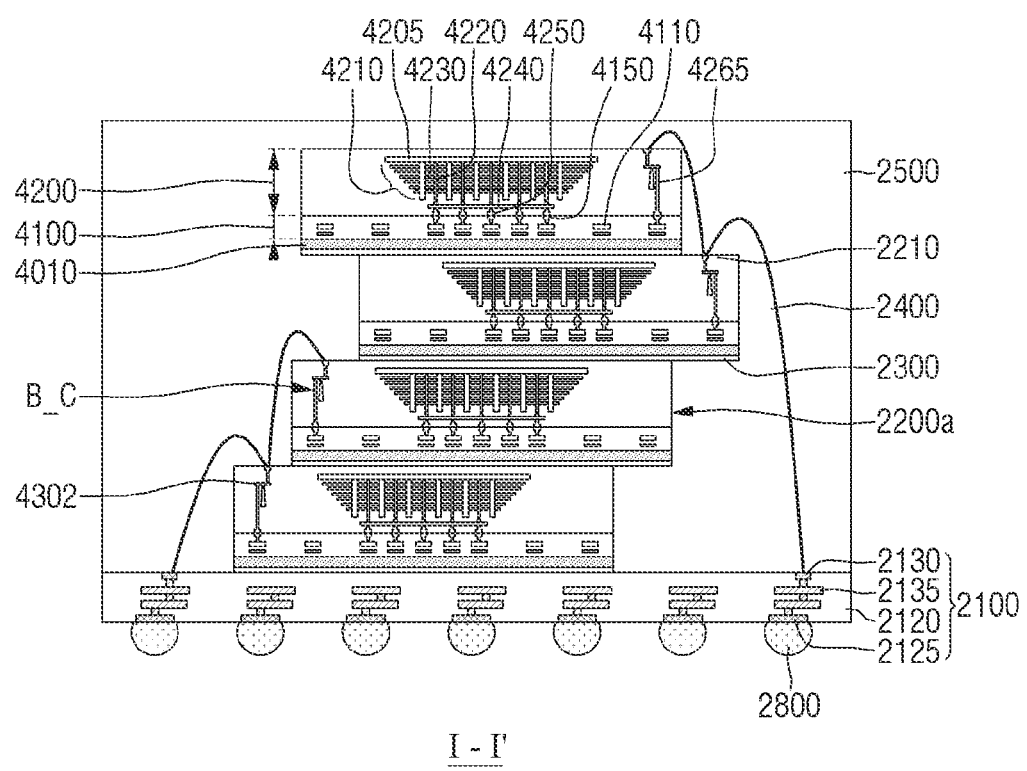
FIG. 24 illustrates an exemplary cross-sectional view of the nonvolatile memory package of FIG. 23 including the nonvolatile memory device taken along a line I-I' according to embodiments of the inventive concepts.
Figure 25:
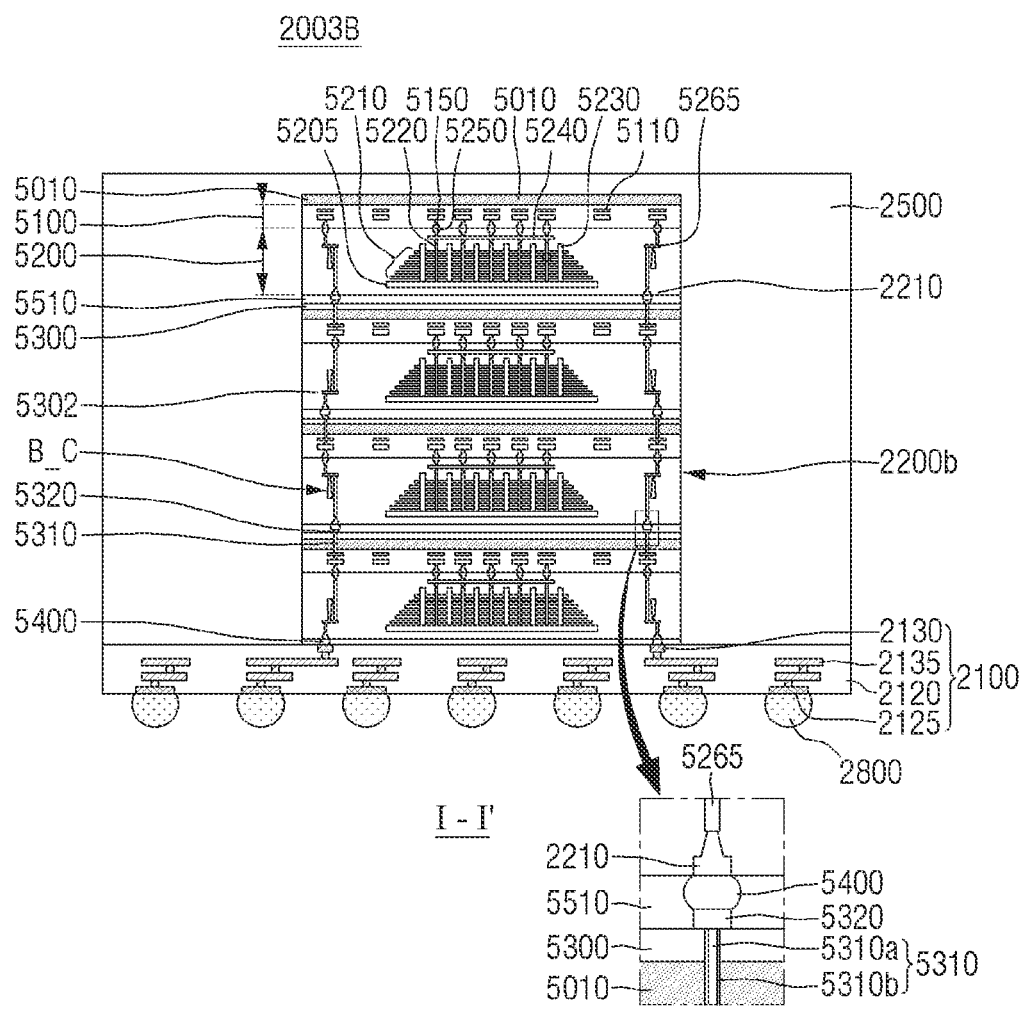
FIG. 25 illustrates an exemplary cross-sectional view of the nonvolatile memory package of FIG. 23 including the nonvolatile memory device taken along a line I-I' according to other embodiments of the inventive concepts.

FIGS. 24 and 25 illustrate exemplary cross-sectional views of the nonvolatile memory package of FIG. 23 taken along line I-I' and including the nonvolatile memory device according to some embodiments.

Referring to FIG. 24, in a semiconductor package 2003A, each of the semiconductor chips 2200a may include a semiconductor substrate 4010, a first structure 4100 on the semiconductor substrate 4010, and a second structure 4200 placed on the first structure 4100 and joined to the first structure 4100 in the wafer bonding way. The semiconductor chips 2200 are disposed on package substrate 2100, which in addition to including upper pads 2130 on the upper (first) surface includes lower pads 2125 on the second (lower) surface and metal layers 2120 and 2135 therein for interconnection. External terminals 2800 may be disposed on the lower pads 2125 for connection to a motherboard for example.

The first structure 4100 may include a peripheral circuit region including a peripheral wiring 4110 and first joining structures 4150. The second structure 4200 may include a common source line 4205, word lines 4210 between the common source line 4205 and the first structure 4100, channel structures 4220 and a separation structure 4230 penetrating the word lines 4210, and second joining structures 4250 electrically connected to the channel structures 4220 and the word lines (WL of FIG. 22) of the word lines 4210. For example, the second joining structures 4250 may be electrically connected to the channel structures 4220 and the word lines (WL of FIG. 22) through the bit lines 4240 electrically connected to the channel structures 4220 and the gate connection wirings (1115 of FIG. 22) electrically connected to the word lines (WL of FIG. 22). The first joining structures 4150 of the first structure 4100 and the second joining structures 4250 of the second structure 4200 may be joined while being in contact with each other. The joined portions between the first joining structures 4150 and the second joining structures 4250 may be formed of, for example, copper (Cu).

The semiconductor chips 2200a including the nonvolatile memory device according to some embodiments may further include a landing pad 4302 in the second structure 4200. Also, a landing pad cut B_C may be further included on the side face of the landing pad 4302. The input/output connection wiring 4265 may be electrically connected to the input/output pad (2210 of FIG. 23). Further, the input/output connection wiring 4265 may be electrically connected to a part of the first joining structures 4150. The input/output connection wiring 4265 may be a common term for the front input/output contact plug and the rear input/output contact plug described with reference to FIGS. 1 to 21. Each of the semiconductor chips 2200a may further include an input/output pad (2210 of FIG. 23) that is electrically connected to the peripheral wirings 4110 of the first structure 4100.

The semiconductor chips 2200a of FIG. 24 may be electrically connected to each other by the bonding wire type connection structures 2400. However, in exemplary embodiments, the semiconductor chips in one semiconductor package, such as the semiconductor chips 2200a of FIG. 24, may also be electrically connected to each other by a connection structure that includes a through silicon via (TSV).

Referring to FIG. 25, in a semiconductor package 2003B, the semiconductor chips 2200b may be arranged perpendicularly to each other. Each of the semiconductor chips 2200b may include a semiconductor substrate 5010, a first structure 5100 formed below the semiconductor substrate 5010, and a second structure 5200 placed below the first structure 5100 and joined to the first structure 5100 in the wafer bonding way.

The first structure 5100 may include a peripheral circuit region including a peripheral wiring 5110 and first joining structures 5150. The second structure 5200 may include a common source line 5205, word lines 5210 between the common source line 5205 and the first structure 5100, channel structures 5220 and separation structures 5230 penetrating the word lines 5210, and second joining structures 5250 electrically connected to the channel structures 5220 and the word lines (WL of FIG. 22) of the word lines 5210. For example, the second joining structures 5250 may be electrically connected to the channel structures 5220 and the word lines (WL of FIG. 22) through the bit lines 5240 electrically connected to the channel structures 5220 and the gate connection wirings (1115 of FIG. 22) electrically connected to the word lines (WL of FIG. 22). The first joining structures 5150 of the first structure 5100 and the second joining structures 5250 of the second structure 5200 may be joined, while being in contact with each other. The joined portion between the first joining structures 5150 and the second joining structures 5250 may be formed of, for example, copper (Cu).

Among the semiconductor chips 2200b, the remaining semiconductor chips except the uppermost semiconductor chip may include a rear insulation layer 5300 on the semiconductor substrate 5010, rear input/output pads 5320 on the rear insulation layer 5300, and through silicon via structures 5310 that penetrate the semiconductor substrate 5010 and the rear insulation layer 5300 and electrically connect the peripheral wirings 5110 of the first structure 5100 and the rear input/output pads 5320. Each of the through silicon via structures 5310 may include a through silicon via 5310a, and an insulating spacer 5310b that surrounds the side faces of the through silicon via 5310a. The semiconductor device 2003B may further include connection structures 5400 placed below each of the semiconductor chips 2200b, for example, conductive bumps. The connection structures 5400 may electrically connect the semiconductor chip 2200b, and may electrically connect the semiconductor chips 2200b and the package substrate 2100. An underfill material layer 5510 may surround the side faces of the conductive bump 5400.

The semiconductor chips 2200b according to some embodiments may further include a landing pad 5302 and a landing pad cut B_C formed on the side face of the landing pad 5302 in the second structure 5200. The input/output contact plug 5265 may be a common term for the front input/output contact plug and the rear input/output contact plug described with reference to FIGS. 1 to 21. The input/output contact plug 5265 may be electrically connected to the input/output pad (2210 of FIG. 23). Also, the input/output contact plug 5265 may be electrically connected to a part of the first joining structures 5150.

In concluding the detailed description, those skilled in the art should appreciate that many variations and modifications may be made to the disclosed embodiments without substantially departing from the inventive concepts. Therefore, the disclosed embodiments should be considered in a generic and descriptive sense only and not for purposes of limitation.

What is claimed is:

1. A nonvolatile memory device comprising:
a substrate including a first surface and a second surface opposite to each other in a first direction;
a ground selection line on the first surface of the substrate;
a plurality of word lines stacked sequentially on the ground selection line;
a channel structure penetrating the ground selection line and the plurality of word lines;
a landing pad spaced apart from the ground selection line and the plurality of word lines in a second direction intersecting the first direction;
a first input/output pad on the second surface of the substrate;
a first front contact plug connected to a first surface of the landing pad and extending in the first direction;
a first rear contact plug disposed between the landing pad and the first input/output pad and connected to a second surface of the landing pad that is opposite the first surface of the landing pad; and
a landing pad cut contacting the landing pad and extending in the first direction.

2. The nonvolatile memory device of claim 1, wherein the landing pad cut includes a first surface of the landing pad cut and a second surface of the landing pad cut,
wherein the second surface of the landing pad cut faces the substrate, and
wherein a width of the first surface of the landing pad is greater than a width of the second surface of the landing pad.

3. The nonvolatile memory device of claim 1, wherein the first front contact plug and the first rear contact plug are disposed between the landing pad cut interposed therebetween.

4. The nonvolatile memory device of claim 1, wherein the channel structure includes a first sub channel structure, a second channel structure, and a channel contact surface between the first sub channel structure and the second channel structure.

5. The nonvolatile memory device of claim 1, further comprising a source region on the substrate,
wherein the channel structure includes a channel layer extending in the first direction, and
wherein the source region is connected to a sidewall of the channel layer.

6. The nonvolatile memory device of claim 1, further comprising:
a second input/output pad on the second surface of the substrate,
a second front contact plug connected to the first surface of the landing pad and extending in the first direction, and
a second rear contact plug disposed between the landing pad and the second input/output pad.

7. The nonvolatile memory device of claim 6, wherein the first front contact plug is spaced apart from the landing pad cut by a first distance on the first surface of the landing pad,
wherein the second front contact plug is spaced apart from the landing pad cut by a second distance on the first surface of the landing pad,
wherein the first rear contact plug is spaced apart from the landing pad cut by a third distance on the second surface of the landing pad,
wherein the second rear contact plug is spaced apart from the landing pad cut by a fourth distance on the second surface of the landing pad, and
wherein a sign of a first value obtained by subtracting the third distance from the first distance is the same as a sign of a second value obtained by subtracting the fourth distance from the second distance.

8. The nonvolatile memory device of claim 1, wherein the landing pad cut is in contact with the substrate.

9. The nonvolatile memory device of claim 1, wherein the landing pad cut is spatially spaced from the first surface of the substrate.

10. The nonvolatile memory device of claim 1, wherein the landing pad is disposed at a same height as the ground selection line.

11. The nonvolatile memory device of claim 1, wherein the landing pad is disposed at a same height as at least one of the plurality of word lines.

12. The nonvolatile memory device of claim 1, further comprising an upper bonding pad electrically connected to the first front contact plug and connected to at least a part of a plurality of circuit elements of the nonvolatile memory device.

13. The nonvolatile memory device of claim 1, wherein the substrate includes a semiconductor region formed of a semiconductor material,
wherein the semiconductor region has a first surface of the semiconductor region and a second surface of the semiconductor region opposite to each other in the first direction,
wherein the first surface of the semiconductor region is planar shape, and
wherein the second surface of the semiconductor region in uneven shape.

14. A nonvolatile memory device comprising:
a peripheral region including a plurality of circuit elements; and
a cell region which is electrically connected to the plurality of circuit elements and that stores data,
wherein the cell region comprises:
a substrate including a first surface and a second surface opposite to each other in a first direction;
a ground selection line on the first surface of the substrate;
a plurality of word lines stacked sequentially on the ground selection line;
a channel structure penetrating the ground selection line and the plurality of word lines;
a landing pad spaced apart from the ground selection line and the plurality of word lines in a second direction intersecting the first direction;
a input/output pad on the second surface of the substrate;
a front contact plug connected to a first surface of the landing pad and extending in the first direction;
a rear contact plug disposed between the landing pad and the input/output pad and connected to a second surface of the landing pad that is opposite the first surface of the landing pad;
a landing pad cut penetrating the landing pad and extending in the first direction; and
an upper bonding pad electrically connected to the front contact plug and connected to at least a part of the plurality of circuit elements.

15. The nonvolatile memory device of claim 14, wherein the landing pad cut includes a first surface of the landing pad cut and a second surface of the landing pad cut,
wherein the second surface of the landing pad cut faces the substrate, and
wherein a width of the first surface of the landing pad is greater than a width of the second surface of the landing pad.

16. The nonvolatile memory device of claim 14, wherein the channel structure includes a first sub channel structure, a second channel structure, and a channel contact surface between the first sub channel structure and the second channel structure.

17. The nonvolatile memory device of claim 14, wherein the landing pad cut is in contact with the substrate.

18. The nonvolatile memory device of claim 14, wherein the cell region further comprises a source region on the substrate,
wherein the channel structure includes a channel layer extending in the first direction, and
wherein the source region is connected to the channel layer.

19. The nonvolatile memory device of claim 14, wherein the front contact plug and the rear contact plug are disposed between the landing pad cut interposed therebetween.

20. A nonvolatile memory system comprising:
a main board;
a nonvolatile memory device on the main board; and
a controller electrically connected to the nonvolatile memory device on the main board,
wherein the nonvolatile memory device comprises:
a substrate including a first surface and a second surface opposite to each other in a first direction;
a ground selection line on the first surface of the substrate;
a plurality of word lines stacked sequentially on the ground selection line;
a channel structure penetrating the ground selection line and the plurality of word lines;
a landing pad spaced apart from the ground selection line and the plurality of word lines in a second direction intersecting the first direction;
an input/output pad on the second surface of the substrate;
a front contact plug connected to a first surface of the landing pad and extending in the first direction;
a rear contact plug disposed between the landing pad and the input/output pad and connected to a second surface of the landing pad that is opposite the first surface of the landing pad;
a landing pad cut penetrating the landing pad and extending in the first direction; and
an upper bonding pad electrically connected to the front contact plug and connected to at least a part of a plurality of circuit elements.

* * * * *